US008279990B2

(12) United States Patent
Song et al.

(10) Patent No.: US 8,279,990 B2
(45) Date of Patent: Oct. 2, 2012

(54) TRANSMITTING/RECEIVING SYSTEM AND METHOD OF PROCESSING DATA IN THE TRANSMITTING/RECEIVING SYSTEM

(75) Inventors: Jae Hyung Song, Seoul (KR); In Hwan Choi, Seoul (KR); Gomer Thomas, Arlington, WA (US)

(73) Assignee: LG Electronics Inc., Seoul (KR)

( * ) Notice: Subject to any disclaimer, the term of this patent is extended or adjusted under 35 U.S.C. 154(b) by 615 days.

(21) Appl. No.: 12/506,154

(22) Filed: Jul. 20, 2009

(65) Prior Publication Data

US 2010/0195766 A1 Aug. 5, 2010

Related U.S. Application Data

(60) Provisional application No. 61/149,031, filed on Feb. 2, 2009, provisional application No. 61/149,347, filed on Feb. 3, 2009, provisional application No. 61/150,315, filed on Feb. 5, 2009, provisional application No. 61/150,318, filed on Feb. 6, 2009, provisional application No. 61/152,268, filed on Feb. 13, 2009.

(30) Foreign Application Priority Data

May 25, 2009 (KR) ........................ 10-2009-0045577

(51) Int. Cl.
*H04L 7/00* (2006.01)
*H04L 25/00* (2006.01)
*G11C 7/00* (2006.01)

(52) U.S. Cl. ......................... 375/355; 375/371; 365/200

(58) Field of Classification Search .................. 375/355, 375/371; 365/200
See application file for complete search history.

(56) References Cited

U.S. PATENT DOCUMENTS

| | | | | |
|---|---|---|---|---|
| 7,142,623 | B2 * | 11/2006 | Sorna | 375/376 |
| 7,386,084 | B2 * | 6/2008 | Yin | 375/371 |
| 7,515,656 | B2 * | 4/2009 | Yamaguchi et al. | 375/326 |
| 2003/0198105 | A1 * | 10/2003 | Yamaguchi et al. | 365/200 |
| 2004/0202266 | A1 * | 10/2004 | Gregorius et al. | 375/355 |
| 2006/0045224 | A1 * | 3/2006 | Cranford et al. | 375/355 |
| 2007/0177702 | A1 * | 8/2007 | Sanders et al. | 375/375 |

(Continued)

OTHER PUBLICATIONS

Advanced Television Systems Commitee (ATSC); "Candidate Standart: ATSC-m/H Standard, Part 2—Mobile/Handheld Digital Television SYstem (A/153, Part 2: 2009)"; Doc No. S4-131r11; Dec. 31, 2008.*

(Continued)

*Primary Examiner* — David C. Payne
*Assistant Examiner* — Sarah Hassan
(74) *Attorney, Agent, or Firm* — Lee, Hong, Degerman, Kang & Waimey

(57) ABSTRACT

A transmitting/receiving system and a data processing method of the same are disclosed herein. The receiving system may include a receiving unit, a first processing unit, and a second processing unit. The receiving unit receives a broadcast signal including mobile service data and an FIC segment from at least one slot. The first processing unit acquires FIC segments from the broadcast signal and obtains an FIC chunk, wherein the obtained FIC chunk is configured of a chunk header and a chunk payload. Herein, the chunk header may include FIC chunk major protocol version information and FIC chunk minor protocol version information, and the chunk payload may include signaling information between at least one ensemble and at least one mobile service. The second processing unit processes the FIC chunk based upon the FIC chunk major protocol version information and the FIC chunk minor protocol version information.

8 Claims, 29 Drawing Sheets

U.S. PATENT DOCUMENTS

2007/0223571 A1* 9/2007 Viss .............................. 375/233

OTHER PUBLICATIONS

Advanced Television Systems Commitee (ATSC); "Candidate Standart: ATSC-m/H Standard, Part 3—Service Multiplex and Transport Subsystem Characteristics (A/153, Part 3: 2009)"; Doc No. S4-132r11; Dec. 31, 2008.*

Advanced Television Systems Committee (ATSC); "Candidate Standard: ATSC-M/H Standard, Part 1—Mobile/Handheld Digital Television System (A/153, Part 1:2009)"; Doc. No. S4-130r12; Dec. 31, 2008.

Advanced Television Systems Committee (ATSC); "Candidate Standard: ATSC-M/H Standard, Part 2—RF/Transmission System Characteristics (A/153, Part 2:2009)"; Doc. No. S4-131r11; Dec. 31, 2008.

Advanced Television Systems Committee (ATSC); "Candidate Standard: ATSC-M/H Standard, Part 3—Service Multiplex and Transport Subsystem Characteristics (A/153, Part 3:2009)"; Doc. No. S4-132r11; Dec. 31, 2008.

Korean Broadcasting System (KBS); "Technology Trend in DTV RF Transmission"; KBS Broadcast Technical Research; 2007; pp. 73-92.

* cited by examiner

FIG. 8

| Syntax | No. of Bits | Format |
|---|---|---|
| FIC_chunk() { | | |
| FIC_chunk_header() | 5*8 | |
| FIC_chunk_payload() | var | |
| } | | |

FIG. 9

| Syntax | No. of Bits | Format |
|---|---|---|
| FIC_chunk_header() { | | |
| FIC_major_protocol_version | 2 | uimsbf |
| FIC_minor_protocol_version | 3 | uimsbf |
| FIC_chunk_header_extension_length | 3 | uimsbf |
| ensemble_loop_header_extension_length | 3 | uimsbf |
| MH_service_loop_extension_length | 3 | uimsbf |
| reserved | 1 | '1' |
| current_next_indicator | 1 | bsblf |
| transport_stream_id | 16 | uimsbf |
| num_ensembles | 8 | uimsbf |
| } | | |

FIG. 12

| Syntax | No. of Bits | Format |
| --- | --- | --- |
| FIC_chunk_payload() { | | |
| for (i=0; i<num_ensembles; i++) { | | |
| ensemble_id | 8 | uimsbf |
| reserved | 3 | '111' |
| ensemble_structure_major_version | 2 | uimsbf |
| ensemble_structure_minor_version | 3 | uimsbf |
| SLT_ensemble_indicator | 1 | bslbf |
| GAT_ensemble_indicator | 1 | bslbf |
| reserved | 1 | '1' |
| MH_service_configuration_version | 5 | uimsbf |
| num_MH_services | 8 | uimsbf |
| for (j=0; j<num_MH_services; j++) { | | |
| MH_service_id | 16 | uimsbf |
| reserved | 3 | '111' |
| multi_ensemble_service | 2 | uimsbf |
| MH_service_status | 2 | uimsbf |
| SP_indicator | 1 | bslbf |
| } | | |
| } | | |
| FIC_chunk_stuffing() | var | |
| } | | |

FIG. 16

| Syntax | No. of Bits | Format |
|---|---|---|
| FIC_segment_header() { | | |
| FIC_type | 2 | uimsbf |
| reserved | 5 | uimsbf |
| error_indicator | 1 | bslbf |
| FIC_segment_num | 4 | uimsbf |
| FIC_last_segment_num | 4 | uimsbf |
| } | | |

FIG. 20

| Syntax | No. of Bits | Format |
|---|---|---|
| FIC_segment_header() { | | |
| FIC_type | 2 | uimsbf |
| FIC_Chunk_major_protocol_version | 2 | uimsbf |
| reserved | 3 | '111' |
| error_indicator | 1 | bslbf |
| FIC_segment_num | 4 | uimsbf |
| FIC_last_segment_num | 4 | uimsbf |
| } | | |

FIG. 22

| | k-1 | k | k+1 | k+2 | k+3 |
|---|---|---|---|---|---|
| No. of Ensemble<br>TNoG | 2<br>4 | 2<br>4 | 2<br>4 | 3<br>7 | 3<br>7 |
| Configuration | (A)(B) | (A)(B) | (A)(B) | (A)(C)(D) | (A)(C)(D) |
| C/N In FIC<br>FIC Ver in TPC | 1<br>5 | 1<br>5 | 0<br>6 | 1<br>6 | 1<br>6 |

FIG. 26

| Syntax | No. of Bits | Format |
|---|---|---|
| FIC_segment_header() { | | |
| FIC_type | 2 | uimsbf |
| FIC_Chunk_major_protocol_version | 2 | uimsbf |
| reserved | 2 | '11' |
| current_next_indicator | 1 | bslbf |
| error_indicator | 1 | bslbf |
| FIC_segment_num | 4 | uimsbf |
| FIC_last_segment_num | 4 | uimsbf |
| } | | |

FIG. 27

| Syntax | No. of Bits | Format |
|---|---|---|
| TPC_data() { | | |
| sub_frame_number | 3 | uimsbf |
| slot_number | 4 | uimsbf |
| parade_id | 7 | uimsbf |
| starting_group_number | 4 | uimsbf |
| number_of_groups | 3 | uimsbf |
| parade_repetition_cycle | 3 | uimsbf |
| rs_frame_mode | 2 | bslbf |
| rs_code_mode_primary | 2 | bslbf |
| rs_code_mode_secondary | 2 | bslbf |
| sccc_block_mode | 2 | bslbf |
| sccc_outer_code_mode_a | 2 | bslbf |
| sccc_outer_code_mode_b | 2 | bslbf |
| sccc_outer_code_mode_c | 2 | bslbf |
| sccc_outer_code_mode_d | 2 | bslbf |
| fic_version | 5 | uimsbf |
| parade_continuity_counter | 4 | uimsbf |
| total_number_of_groups | 5 | uimsbf |
| reserved | 21 | bslbf |
| tpc_protocol_version | 5 | bslbf |
| } | | |

TRANSMITTING/RECEIVING SYSTEM AND METHOD OF PROCESSING DATA IN THE TRANSMITTING/RECEIVING SYSTEM

This application claims the benefit of U.S. Provisional Application No. 61/149,031, filed on Feb. 2, 2009, which is hereby incorporated by reference as if fully set forth herein. This application also claims the benefit of U.S. Provisional Application No. 61/149,347, filed on Feb. 3, 2009, which is hereby incorporated by reference as if fully set forth herein. This application also claims the benefit of U.S. Provisional Application No. 61/150,315, filed on Feb. 5, 2009, which is hereby incorporated by reference as if fully set forth herein. This application also claims the benefit of U.S. Provisional Application No. 61/150,318, filed on Feb. 6, 2009, which is hereby incorporated by reference as if fully set forth herein. This application also claims the benefit of U.S. Provisional Application No. 61/152,268, filed on Feb. 13, 2009, which is hereby incorporated by reference as if fully set forth herein. And this application claims the benefit of Korean Application No. 10-2009-0045577, filed on May 25, 2009, which is hereby incorporated by reference.

BACKGROUND OF THE INVENTION

1. Field of the Invention

The present invention relates to a transmitting system for transmitting a digital broadcasting signal, a receiving system (or receiver) for receiving the digital broadcasting signal transmitted from the transmitting system, and a method of processing data in the transmitting system and the receiving system (or receiving system).

2. Discussion of the Related Art

The Vestigial Sideband (VSB) transmission mode, which is adopted as the standard for digital broadcasting in North America and the Republic of Korea, is a system using a single carrier method. Therefore, the receiving performance of the receiving system may be deteriorated in a poor channel environment. Particularly, since resistance to changes in channels and noise is more highly required when using portable and/or mobile broadcast receivers, the receiving performance may be even more deteriorated when transmitting mobile service data by the VSB transmission mode.

SUMMARY OF THE INVENTION

Accordingly, the present invention is directed to a transmitting/receiving system and a data processing method that substantially obviate one or more problems due to limitations and disadvantages of the related art.

An object of the present invention is to provide a transmitting/receiving system and a data processing method that are highly resistant to channel changes and noise.

Another object of the present invention is to provide a transmitting/receiving system and a data processing method that can perform efficient channel setting by using signaling information.

A further object of the present invention is to provide a transmitting/receiving system and a data processing method that can also perform efficient channel setting by using FIC (fast information channel).

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of processing data in a receiving system includes the steps of receiving a broadcast signal including mobile service data and an FIC segment from at least one slot, wherein a transmission frame is configured of a plurality of sub-frames for receiving at least one ensemble and at least one mobile service, and wherein a sub-frame is configured of a plurality of slots, acquiring FIC segments from the broadcast signal and obtaining an FIC chunk, the obtained FIC chunk being configured of a chunk header and a chunk payload, wherein the chunk header includes FIC chunk major protocol version information and FIC chunk minor protocol version information, and wherein the chunk payload includes signaling information between at least one ensemble and at least one mobile service, and processing the FIC chunk based upon the FIC chunk major protocol version information and the FIC chunk minor protocol version information included in the chunk header of the FIC chunk.

Herein, the chunk header may further include at least one of an extension length information of an FIC chunk header, an extension length information of an ensemble loop header, and an extension length information of a mobile service loop, and an information on number of ensembles being signaled in the FIC chunk.

An n1-byte FIC chunk header extension information (wherein $n1 \geqq 0$) corresponding to the extension length information of the FIC chunk header may be added to an end of the FIC chunk header. An n2-byte ensemble loop header extension information (wherein $n2 \geqq 0$) corresponding to the extension length information of the ensemble loop header may be added to an end of the ensemble loop header. And, an n3-byte mobile service loop extension information (wherein $n3 \geqq 0$) corresponding to the extension length information of the mobile service loop may be added to an end of the mobile service loop.

Also, each FIC segment configuring the FIC chunk may include a 2-byte segment header and a 35-byte segment payload. Herein, the segment header may include an FIC type information, a number of a corresponding FIC segment among multiple FIC segments divided from the FIC chunk, and a number of a last FIC segment among the multiple FIC segments divided from the FIC chunk. And, the segment payload may include a portion of the signaling information between at least one ensemble and at least one mobile service.

According to another aspect of the present invention, a receiving system includes a receiving unit, a first processing unit, and a second processing unit. The receiving unit receives a broadcast signal including mobile service data and an FIC segment from at least one slot. Herein, a transmission frame is configured of a plurality of sub-frames for receiving at least one ensemble and at least one mobile service, and a sub-frame is configured of a plurality of slots. The first processing unit acquires FIC segments from the broadcast signal and obtains an FIC chunk, wherein the obtained FIC chunk is configured of a chunk header and a chunk payload. Herein, the chunk header may include FIC chunk major protocol version information and FIC chunk minor protocol version information, and the chunk payload may include signaling information between at least one ensemble and at least one mobile service. The second processing unit processes the FIC chunk based upon the FIC chunk major protocol version information and the FIC chunk minor protocol version information included in the chunk header of the FIC chunk.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 8 illustrates a syntax structure of an FIC chunk according to an embodiment of the present invention;

FIG. 9 illustrates a syntax structure of an FIC chunk header according to an embodiment of the present invention;

FIG. 12 illustrates a syntax structure of an FIC chunk payload according to an embodiment of the present invention;

FIG. 16 illustrates a syntax structure of an FIC segment header according to an embodiment of the present invention;

FIG. 20 illustrates a syntax structure of an FIC segment header according to another embodiment of the present invention;

FIG. 22 illustrates an exemplary occurrence of reconfiguration of a FIC chunk according to the present invention;

FIG. 26 illustrates a syntax structure of an FIC segment header according to another embodiment of the present invention;

FIG. 27 illustrates a syntax structure of an TPC data according to an embodiment of the present invention;

DETAILED DESCRIPTION OF THE INVENTION

Figure 1:
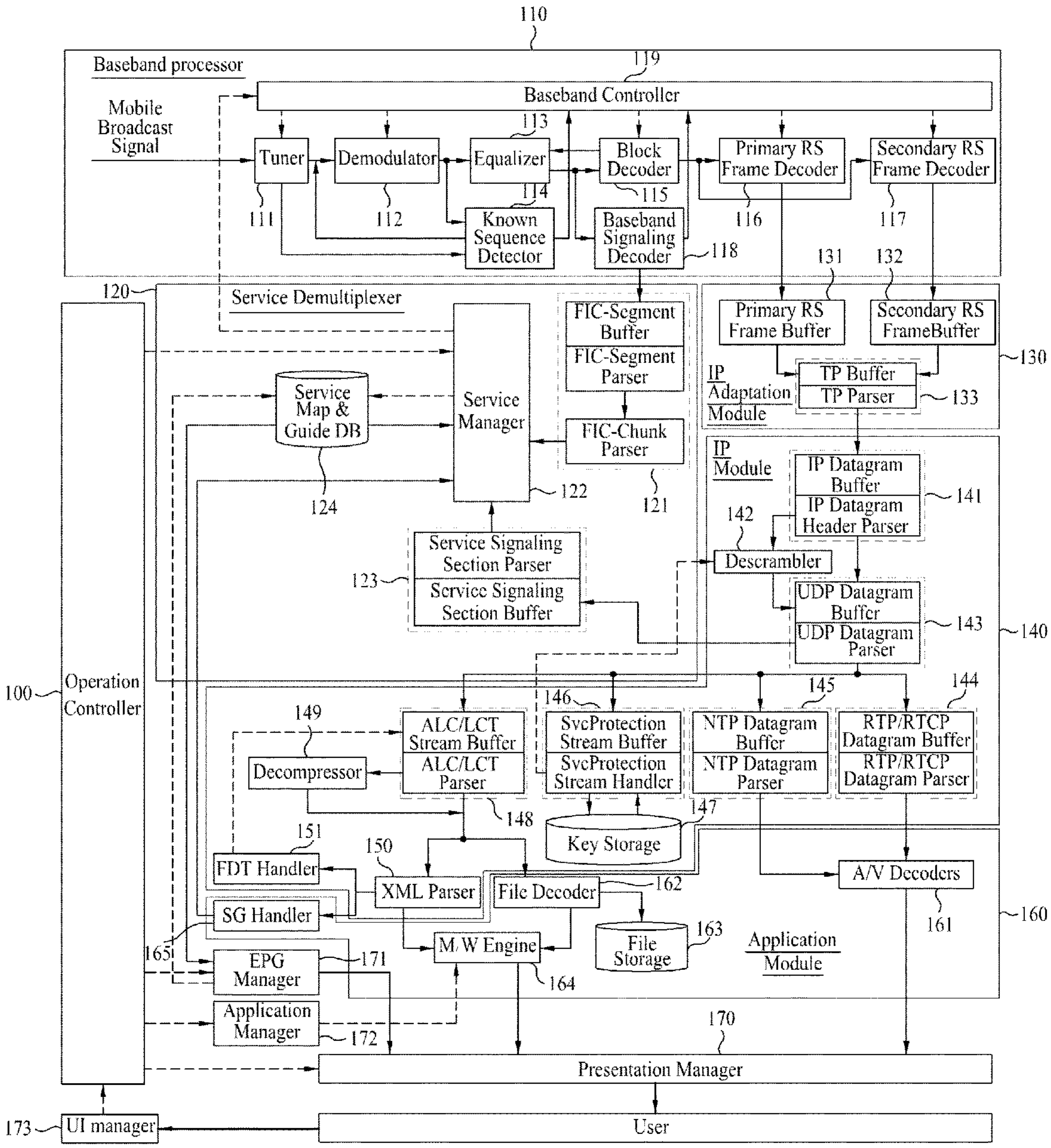
FIG. 1 illustrates a block diagram showing a general structure of a receiving system according to an embodiment of the present invention.

Reference will now be made in detail to the preferred embodiments of the present invention, examples of which are illustrated in the accompanying drawings. Wherever possible, the same reference numbers will be used throughout the drawings to refer to the same or like parts. In addition, although the terms used in the present invention are selected from generally known and used terms, some of the terms mentioned in the description of the present invention have been selected by the applicant at his or her discretion, the detailed meanings of which are described in relevant parts of the description herein. Furthermore, it is required that the present invention is understood, not simply by the actual terms used but by the meaning of each term lying within.

Among the terms used in the description of the present invention, main service data correspond to data that can be received by a fixed receiving system and may include audio/video (A/V) data. More specifically, the main service data may include A/V data of high definition (HD) or standard definition (SD) levels and may also include diverse data types required for data broadcasting. Also, the known data correspond to data pre-known in accordance with a pre-arranged agreement between the receiving system and the transmitting system.

Additionally, among the terms used in the present invention, "M/H" (or MH) corresponds to the initials of "mobile" and "handheld" and represents the opposite concept of a fixed-type system. Furthermore, the M/H service data may include at least one of mobile service data, and handheld service data, and will also be referred to as "mobile service data" for simplicity. Thereafter, the M/H, MH, and mobile is used as the same meaning. Herein, the mobile service data not only correspond to M/H service data but may also include any type of service data with mobile or portable characteristics. Therefore, the mobile service data according to the present invention are not limited only to the M/H service data.

The above-described mobile service data may correspond to data having information, such as program execution files, stock information, and so on, and may also correspond to A/V data. Most particularly, the mobile service data may correspond to A/V data having lower resolution and lower data rate as compared to the main service data. For example, if an A/V codec that is used for a conventional main service corresponds to a MPEG-2 codec, a MPEG-4 advanced video coding (AVC) or scalable video coding (SVC) having better image compression efficiency may be used as the A/V codec for the mobile service. Furthermore, any type of data may be transmitted as the mobile service data. For example, transport protocol expert group (TPEG) data for broadcasting real-time transportation information may be transmitted as the main service data.

Also, a data service using the mobile service data may include weather forecast services, traffic information services, stock information services, viewer participation quiz programs, real-time polls and surveys, interactive education broadcast programs, gaming services, services providing information on synopsis, character, background music, and filming sites of soap operas or series, services providing information on past match scores and player profiles and achievements, and services providing information on product information and programs classified by service, medium, time, and theme enabling purchase orders to be processed. Herein, the present invention is not limited only to the services mentioned above. In the present invention, the transmitting system provides backward compatibility in the main service data so as to be received by the conventional receiving system. Herein, the main service data and the mobile service data are multiplexed to the same physical channel and then transmitted.

In the present invention, the transmitting system provides backward compatibility in the main service data so as to be received by the conventional receiving system. Herein, the main service data and the mobile service data are multiplexed to the same physical channel and then transmitted.

Furthermore, the transmitting system according to the present invention performs additional encoding on the mobile service data and inserts the data already known by the receiving system and transmitting system (e.g., known data), thereby transmitting the processed data.

Therefore, when using the transmitting system according to the present invention, the receiving system may receive the mobile service data during a mobile state and may also receive the mobile service data with stability despite various distortion and noise occurring within the channel.

According to an embodiment of the present invention, the transmitting system and the receiving system operate two different types of data channels: an RS frame data channel for transmitting contents and a fast information channel (FIC) data channel for acquisiting service.

More specifically, the present invention can signal mapping information between an ensemble and a mobile service by using an FIC chunk, and can divide and transmit the FIC chunk into FIC segment units, thereby enabling a receiving system to perform quick service acquisition.

Furthermore, the present invention can transmit multiple FIC segments divided from an FIC chunk through a single sub-frame or through multiple sub-frames, thereby preventing FIC segments from being wasted, when a data size of the FIC chunk is smaller or larger than the data size of the FIC segments being transmitted through a single sub-frame.

In addition, the present invention can transmit protocol version information of an FIC chunk corresponding to an FIC segment through a header of the FIC segment, thereby enabling the receiving system to accurately recover (or obtains) the FIC chunk by using the FIC segments configured of the corresponding protocol version, even when FIC chunks of different protocol versions co-exist in a single M/H frame.

The present invention also can transmit identification information for identifying whether the signaling information being transmitted to the payload of the corresponding FIC segment through the header of the FIC segment corresponds to signaling information of the current M/H frame or to signaling information of the next M/H frame, thereby enabling the receiving system to accurately recover the FIC chunk by using the FIC segments of the corresponding M/H frame, even when an FIC chunk signaling ensemble configuration information of the current M/H frame and an FIC chunk signaling ensemble configuration information of the next M/H frame co-exist in a single M/H frame.

Receiving System

FIG. 1 illustrates a block diagram showing a general structure of a receiving system according to an embodiment of the present invention. Referring to FIG. 1, the arrow shown in dotted line indicates a data path, and the arrow shown in slid line indicates a control signal path.

The receiving system according to the present invention may include an operation controller 100, a tuner 111, a demodulator 112, an equalizer 113, a known sequence detector (or known data detector) 114, a block decoder 115, a primary Reed-Solomon (RS) frame decoder 116, a secondary RS frame decoder 117, a signaling decoder 118, and a baseband controller 119. The receiving system according to the present invention may further include an FIC handler 121, a service manager 122, a service signaling handler 123, and a first storage unit 124. The receiving system according to the present invention may further include a primary RS frame buffer 131, a secondary RS frame buffer 132, and a transport packet (TS) handler 133. The receiving system according to the present invention may further include an Internet Protocol (IP) datagram handler 141, a descrambler 142, an User Datagram Protocol (UDP) datagram handler 143, a Real-time Transport Protocol/Real-time Transport Control Protocol (RTP/RTCP) datagram handler 144, a Network Time Protocol (NTP) datagram handler 145, a service protection stream handler 146, a second storage unit 147, an Asynchronous Layered Coding/Layered Coding Transport (ALC/LCT) stream handler 148, an Extensible Mark-up Language (XML) parser 150, and a Field Device Tool (FDT) handler 151. The receiving system according to the present invention may further include an Audio/Video (A/V) decoder 161, a file decoder 162, a third storage unit 163, a middle ware (M/W) engine 164, and a Service Guide (SG) handler 165. The receiving system according to the present invention may further include an Electronic Program Guide (EPG) manager 171, an application manager 172, and an User Interface (UI) manager 173.

Herein, for simplicity of the description of the present invention, the operation controller 100, the tuner 111, the demodulator 112, the equalizer 113, the known sequence detector (or known data detector) 114, the block decoder 115, the primary RS frame decoder 116, the secondary RS frame decoder 117, the signaling decoder 118, and the baseband controller 119 will be collectively referred to as a baseband processor 110. The FIC handler 121, the service manager 122, the service signaling handler 123, and the first storage unit 124 will be collectively referred to as a service multiplexer 120. The primary RS frame buffer 131, the secondary RS frame buffer 132, and the TS handler 133 will be collectively referred to as an IP adaptation module 130. The IP datagram handler 141, the descrambler 142, the UDP datagram handler 143, the RTP/RTCP datagram handler 144, the NTP datagram handler 145, the service protection stream handler 146, the second storage unit 147, the ALC/LCT stream handler 148, the XML parser 150, and the FDT handler 151 will be collectively referred to as a common IP module 140. The A/V decoder 161, the file decoder 162, the third storage unit 163, the M/W engine 164, and the SG handler 165 will be collectively referred to as an application module 160.

In addition, although the terms used in FIG. 1 are selected from generally known and used terms, some of the terms mentioned in the description of FIG. 1 have been selected by the applicant at his or her discretion, the detailed meanings of which are described in relevant parts of the description herein. Furthermore, it is required that the present invention is understood, not simply by the actual terms used but by the meaning of each term lying within.

Referring to FIG. 1, the baseband controller 119 controls the operation of each block included in the baseband processor 110.

By tuning the receiving system to a specific physical channel frequency (or physical transmission channel frequency, PTC), the tuner 111 enables the receiving system to receive main service data, which correspond to broadcast signals for fixed-type broadcast receiving systems, and mobile service data, which correspond to broadcast signals for mobile broadcast receiving systems. At this point, the tuned frequency of the specific physical channel is down-converted to an intermediate frequency (IF) signal, thereby being outputted to the demodulator 112 and the known sequence detector 114. The passband digital IF signal being outputted from the tuner 111 may only include main service data, or only include mobile service data, or include both main service data and mobile service data.

The demodulator 112 performs self-gain control, carrier recovery, and timing recovery processes on the passband digital IF signal inputted from the tuner 111, thereby modifying the IF signal to a baseband signal. Then, the demodulator 112 outputs the baseband signal to the equalizer 113 and the known sequence detector 114. The demodulator 112 uses the known data symbol sequence inputted from the known sequence detector 114 during the timing and/or carrier recovery, thereby enhancing the demodulating performance. The equalizer 113 compensates channel-associated distortion included in the signal demodulated by the demodulator 112. Then, the equalizer 113 outputs the distortion-compensated signal to the block decoder 115. By using a known data symbol sequence inputted from the known sequence detector 114, the equalizer 113 may enhance the equalizing performance. Furthermore, the equalizer 113 may receive feedback on the decoding result from the block decoder 115, thereby enhancing the equalizing performance.

The known sequence detector 114 detects known data place (or position) inserted by the transmitting system from the input/output data (i.e., data prior to being demodulated or data being processed with partial demodulation). Then, the known sequence detector 114 outputs the detected known data position information and known data sequence generated from the detected position information to the demodulator 112, the equalizer 113, and the baseband controller 119. Additionally, in order to allow the block decoder 115 to identify the mobile service data that have been processed with additional encoding by the transmitting system and the main service data that have not been processed with any additional encoding, the known sequence detector 114 outputs such corresponding information to the block decoder 115.

If the data channel-equalized by the equalizer 113 and inputted to the block decoder 115 correspond to data processed with both block-encoding of serial concatenated convolution code (SCCC) method and trellis-encoding by the transmitting system (i.e., data within the RS frame, signaling data), the block decoder 115 may perform trellis-decoding and block-decoding as inverse processes of the transmitting system. On the other hand, if the data channel-equalized by the equalizer 113 and inputted to the block decoder 115 correspond to data processed only with trellis-encoding and not block-encoding by the transmitting system (i.e., main service data), the block decoder 115 may perform only trellis-decoding.

The signaling decoder 118 decodes signaling data that have been channel-equalized and inputted from the equalizer 113. It is assumed that the signaling data (or signaling information) inputted to the signaling decoder 118 correspond to data processed with both block-encoding and trellis-encoding by the transmitting system. Examples of such signaling data may include transmission parameter channel (TPC) data and fast information channel (FIC) data.

For example, among the data that are being inputted, the signaling decoder 118 performs regressive turbo decoding of a parallel concatenated convolution code (PCCC) method on data corresponding to the signaling information region. Subsequently, the signaling decoder 118 separates FIC data and TPC data from the regressive-turbo-decoded signaling data. Additionally, the signaling decoder 118 performs RS-decoding as inverse processes of the transmitting system on the separated TPC data, thereby outputting the processed data to the baseband controller 119. Also, the signaling decoder 118 performs deinterleaving in sub-frame units on the separated FIC data, so as to perform RS-decoding as inverse processes of the transmitting system on the deinterleaved FIC data, thereby outputting the processed data to the FIC handler 121. The FIC data being deinterleaved and RS-decoded from the signaling decoder 118 and outputted to the FIC handler 121 are transmitted in units of FIC segments.

The FIC handler 121 receives FIC data from the signaling decoder 118, so as to extract signaling information for service acquisition (i.e., mapping information between an ensemble and a mobile service). In order to do so, the FIC handler 121 may include an FIC segment buffer, an FIC segment parser, and an FIC chunk parser.

The FIC segment buffer buffers FIC segment groups being inputted in M/H frame units from the signaling decoder 118, thereby outputting the buffered FIC segment groups to the FIC segment parser. Thereafter, the FIC segment parser extracts the header of each FIC segment stored in the FIC segment buffer so as to analyze the extracted headers. Then, based upon the analyzed result, the FIC segment parser outputs the payload of the respective FIC segments to the FIC chunk parser. The FIC chunk parser uses the analyzed result outputted from the FIC segment parser so as to recover the FIC chunk data structure from the FIC segment payloads, thereby analyzing the received FIC chunk data structure. Subsequently, the FIC chunk parser extracts the signaling information for service acquisition. The signaling information acquired from the FIC chunk parser is outputted to the service manager 122.

Meanwhile, the service signaling handler 123 consists of a service signaling buffer and a service signaling parser. Herein, the service signaling handler 123 buffers table sections of a service signaling channel being transmitted from the UDP datagram handler 143, thereby analyzing and processing the buffered table sections. Similarly, the signaling information processed by the service signaling handler 123 is also outputted to the service manager 122.

The service manager 122 uses the signaling information collected from each of the FIC handler 121 and the service signaling handler 123, so as to configure a service map. Thereafter, the service manager 122 uses a service guide (SG) collected from the service guide (SG) handler 165 so as to draw up a program guide. Then, the service manager 122 controls the baseband controller 119 so that a user can receive (or be provided with) a user-requested mobile service by referring to the service map and service guide. Furthermore, the service manager 122 may also control the receiving system so that the program guide can be displayed on at least a portion of the display screen based upon the user's input.

The first storage unit 124 stores the service map and service guide drawn up by the service manager 122. Also, based upon the requests from the service manager 122 and the EPG manager 171, the first storage unit 124 extracts the required data, which are then transferred to the service manager 122 and/or the EPG manager 171.

The baseband controller 119 receives the known data place information and TPC data, thereby transferring M/H frame time information, information indicating whether or not a data group exists in a selected parade, place information of known data within a corresponding data group, power control information, and so on to each block within the baseband processor 110. The TPC data will be described in detail in a later.

Meanwhile, according to the present invention, the transmitting system uses RS frames by encoding units. Herein, the RS frame may be divided into a primary RS frame and a secondary RS frame. However, according to the embodiment of the present invention, the primary RS frame and the secondary RS frame will be divided based upon the level of importance of the corresponding data.

The primary RS frame decoder 116 receives the data outputted from the block decoder 115. At this point, according to the embodiment of the present invention, the primary RS frame decoder 116 receives only the mobile service data that have been Reed-Solomon (RS)-encoded and/or cyclic redundancy check (CRC)-encoded from the block decoder 115.

Herein, the primary RS frame decoder 116 receives only the mobile service data and not the main service data. The primary RS frame decoder 116 performs inverse processes of an RS frame encoder (not shown) included in the digital broadcast transmitting system, thereby correcting errors existing within the primary RS frame. More specifically, the primary RS frame decoder 116 forms a primary RS frame by grouping a plurality of data groups and, then, correct errors in primary RS frame units. In other words, the primary RS frame decoder 116 decodes primary RS frames, which are being transmitted for actual broadcast services. The primary RS frame decoded by the primary RS frame decoder 116 outputs to the primary RS frame buffer 131. The primary RS frame buffer 131 buffers the primary RS frame, and then configures an M/H TP in each row unit. The M/H TPs of the primary RS frame outputs to the TP handler 133.

Additionally, the secondary RS frame decoder 117 receives the data outputted from the block decoder 115. At this point, according to the embodiment of the present invention, the secondary RS frame decoder 117 receives only the mobile service data that have been RS-encoded and/or CRC-encoded from the block decoder 115. Herein, the secondary RS frame decoder 117 receives only the mobile service data and not the main service data. The secondary RS frame decoder 117 performs inverse processes of an RS frame encoder (not shown) included in the digital broadcast transmitting system, thereby correcting errors existing within the secondary RS frame. More specifically, the secondary RS frame decoder 117 forms a secondary RS frame by grouping a plurality of data groups and, then, correct errors in secondary RS frame units. In other words, the secondary RS frame decoder 117 decodes secondary RS frames, which are being transmitted for mobile audio service data, mobile video service data, guide data, and so on. The secondary RS frame decoded by the secondary RS frame decoder 117 outputs to the secondary RS frame buffer 132. The secondary RS frame buffer 132 buffers the secondary RS frame, and then configures an M/H TP in each row unit. The M/H TPs of the secondary RS frame outputs to the TP handler 133.

The TP handler 133 consists of a TP buffer and a TP parser. The TP handler 133 buffers the M/H TPs inputted from the primary RS frame buffer 131 and the secondary RS frame buffer 132, and then extracts and analyzes each header of the buffered M/H TPs, thereby recovering IP datagram from each payload of the corresponding M/H TPs. The recovered IP datagram is outputted to the IP datagram handler 141.

The IP datagram handler 141 consists of an IP datagram buffer and an IP datagram parser. The IP datagram handler 141 buffers the IP datagram delivered from the TP handler 133, and then extracts and analyzes a header of the buffered IP datagram, thereby recovering UDP datagram from a payload of the corresponding IP datagram. The recovered UDP datagram is outputted to the UDP datagram handler 143.

If the UDP datagram is scrambled, the scrambled UDP datagram is descrambled by the descrambler 142, and the descrambled UDP datagram is outputted to the UDP datagram handler 143. For example, when the UDP datagram among the received IP datagram is scrambled, the descrambler 142 descrambles the UDP datagram by inputting an encryption key and so on from the service protection stream handler 146, and outputs the descrambled UDP datagram to the UDP datagram handler 143.

The UDP datagram handler 143 consists of an UDP datagram buffer and an UDP datagram parser. The UDP datagram handler 143 buffers the UDP datagram delivered from the IP datagram handler 141 or the descrambler 142, and then extracts and analyzes a header of the buffered UDP datagram, thereby recovering data transmitted through a payload of the corresponding UDP datagram. If the recovered data is an RTP/RTCP datagram, the recovered data is outputted to the RTP/RTCP datagram handler 144. If the recovered data is also an NTP datagram, the recovered data is outputted to the NTP datagram handler 145. Furthermore, if the recovered data is a service protection stream, the recovered data is outputted to the service protection stream handler 146. And, if the recovered data is an ALC/LCT stream, the recovered data is outputted to the ALC/LCT steam handler 148.

The RTP/RTCP datagram handler 144 consists of an RTP/RTCP datagram buffer and an RTP/RTCP datagram parser. The RTP/RTCP datagram handler 144 buffers the data of RTP/RTCP structure outputted from the UDP datagram handler 143, and then extracts A/V stream from the buffered data, thereby outputting the extracted A/V stream to the A/V decoder 161.

The A/V decoder 161 decodes the audio and video streams outputted from the RTP/RTCP datagram handler 144 using audio and video decoding algorithms, respectively. The decoded audio and video data is outputted to the presentation manager 170. Herein, at least one of an AC-3 decoding algorithm, an MPEG 2 audio decoding algorithm, an MPEG 4 audio decoding algorithm, an AAC decoding algorithm, an AAC+ decoding algorithm, an HE AAC decoding algorithm, an AAC SBR decoding algorithm, an MPEG surround decoding algorithm, and a BSAC decoding algorithm can be used as the audio decoding algorithm and at least one of an MPEG 2 video decoding algorithm, an MPEG 4 video decoding algorithm, an H.264 decoding algorithm, an SVC decoding algorithm, and a VC-1 decoding algorithm can be used as the audio decoding algorithm.

The NTP datagram handler 145 consists of an NTP datagram buffer and an NTP datagram parser. The NTP datagram handler 145 buffers data having an NTP structure, the data being outputted from the UDP datagram handler 143. Then, the NTP datagram handler 145 extracts an NTP stream from the buffered data. Thereafter, the extracted NTP stream is outputted to the A/V decoder 161 so as to be decoded.

The service protection stream handler 146 may further include a service protection stream buffer. Herein, the service protection stream handler 146 buffers data designated (or required) for service protection, the data being outputted from the UDP datagram handler 143. Subsequently, the service protection stream handler 146 extracts information required for descrambling from the extracted data. The information required for descrambling includes a key value, such as SKTM and LKTM. The information for descrambling is stored in the second storage unit 147, and, when required, the information for descrambling is outputted to the descrambler 142.

The ALC/LCT stream handler 148 consists of an ALC/LCT stream buffer and an ALC/LCT stream parser. And, the ALC/LCT stream handler 148 buffers data having an ALC/LCT structure, the data being outputted from the UDP datagram handler 143. Then, the ALC/LCT stream handler 148 analyzes a header and a header expansion of an ALC/LCT session from the buffered data. Based upon the analysis result of the header and header expansion of the ALC/LCT session, when the data being transmitted to the ALC/LCT session correspond to an XML structure, the corresponding data are outputted to an XML parser 150. Alternatively, when the data being transmitted to the ALC/LCT session correspond to a file structure, the corresponding data are outputted to a file decoder 162. At this point, when the data that are being transmitted to the ALC/LCT session are compressed, the compressed data are decompressed by a decompressor 149, thereby being outputted to the XML parser 150 or the file decoder 162.

The XML parser 150 analyses the XML data being transmitted through the ALC/LCT session. Then, when the analyzed data correspond to data designated to a file-based service, the XML parser 150 outputs the corresponding data to the FDT handler 151. On the other hand, if the analyzed data correspond to data designated to a service guide, the XML parser 150 outputs the corresponding data to the SG handler 165. The FDT handler 151 analyzes and processes a file description table of a FLUTE protocol, which is transmitted in an XML structure through the ALC/LCT session.

The SG handler 165 collects and analyzes the data designated for a service guide, the data being transmitted in an XML structure, thereby outputting the analyzed data to the service manager 122.

The file decoder 162 decodes the data having a file structure and being transmitted through the ALC/LCT session, thereby outputting the decoded data to the middleware engine 164 or storing the decoded data in a third storage unit 163. Herein, the middleware engine 164 translates the file structure data (i.e., the application) and executes the translated application. Thereafter, the application may be outputted to an output device, such as a display screen or speakers, through the application presentation manager 170. According to an embodiment of the present invention, the middleware engine 164 corresponds to a JAVA-based middleware engine.

Based upon a user-input, the EPG manager 171 receives EPG data either through the service manager 122 or through the SG handler 165, so as to convert the received EPG data to a display format, thereby outputting the converted data to the presentation manager 170.

The application manager 172 performs overall management associated with the processing of application data, which are being transmitted in object formats, file formats, and so on. Furthermore, based upon a user-command inputted through the UI manager 173, the operation controller 100 controls at least one of the service manager 122, the EPG manager 171, the application manager 172, and the presentation manager 170, so as to enable the user-requested function to be executed. The UI manager 173 transfers the user-input to the operation controller 100 through the UI.

Finally, the presentation manager 170 provides at least one of the audio and video data being outputted from the A/V decoder 161 and the EPG data being outputted from the EPG manager 171 to the user through the speaker and/or display screen.

Data Format Structure

Meanwhile, the data structure used in the mobile broadcasting technology according to the embodiment of the present invention may include a data group structure and an RS frame structure, which will now be described in detail.

Figure 2:
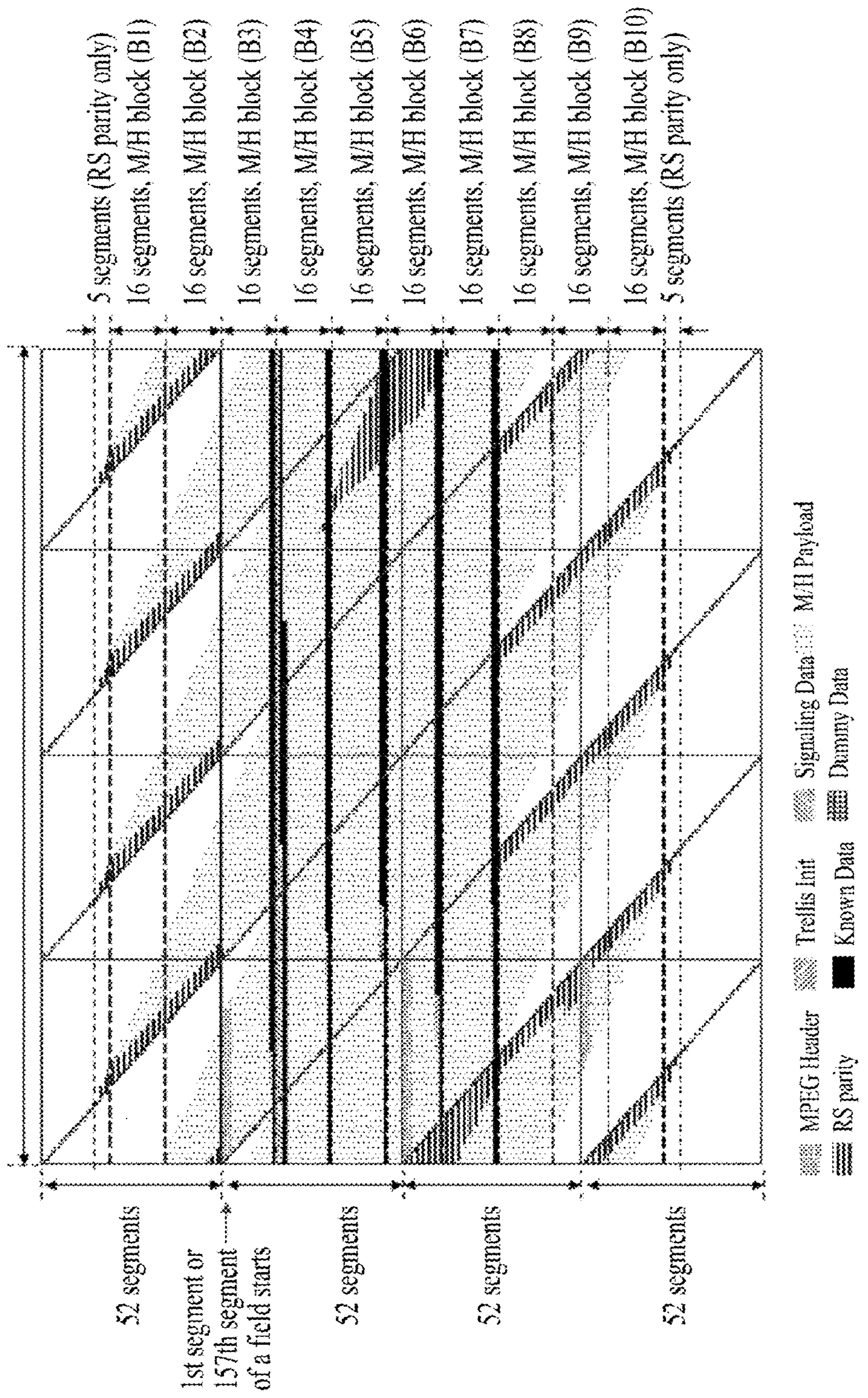
FIG. 2 illustrates an exemplary structure of a data group according to the present invention.

FIG. 2 illustrates an exemplary structure of a data group according to the present invention. FIG. 2 shows an example of dividing a data group according to the data structure of the present invention into 10 M/H blocks (i.e., M/H block 1 (B1) to M/H block 10 (B10)). In this example, each M/H block has the length of 16 segments. Referring to FIG. 2, only the RS parity data are allocated to portions of the 5 segments before the M/H block 1 (B1) and the 5 segments following the M/H block 10 (B10). The RS parity data are excluded in regions A to D of the data group. More specifically, when it is assumed that one data group is divided into regions A, B, C, and D, each M/H block may be included in any one of region A to region D depending upon the characteristic of each M/H block within the data group.

Herein, the data group is divided into a plurality of regions to be used for different purposes. More specifically, a region of the main service data having no interference or a very low interference level may be considered to have a more resistant (or stronger) receiving performance as compared to regions having higher interference levels. Additionally, when using a system inserting and transmitting known data in the data group, wherein the known data are known based upon an agreement between the transmitting system and the receiving system, and when consecutively long known data are to be periodically inserted in the mobile service data, the known data having a predetermined length may be periodically inserted in the region having no interference from the main service data (i.e., a region wherein the main service data are not mixed). However, due to interference from the main service data, it is difficult to periodically insert known data and also to insert consecutively long known data to a region having interference from the main service data.

Referring to FIG. 2, M/H block 4 (B4) to M/H block 7 (B7) correspond to regions without interference of the main service data. M/H block 4 (B4) to M/H block 7 (B7) within the data group shown in FIG. 2 correspond to a region where no interference from the main service data occurs. In this example, a long known data sequence is inserted at both the beginning and end of each M/H block. In the description of the present invention, the region including M/H block 4 (B4) to M/H block 7 (B7) will be referred to as "region A (=B4+B5+B6+B7)". As described above, when the data group includes region A having a long known data sequence inserted at both the beginning and end of each M/H block, the receiving system is capable of performing equalization by using the channel information that can be obtained from the known data. Therefore, the strongest equalizing performance may be yielded (or obtained) from one of region A to region D.

In the example of the data group shown in FIG. 2, M/H block 3 (B3) and M/H block 8 (B8) correspond to a region having little interference from the main service data. Herein, a long known data sequence is inserted in only one side of each M/H block B3 and B8. More specifically, due to the interference from the main service data, a long known data sequence is inserted at the end of M/H block 3 (B3), and another long known data sequence is inserted at the beginning of M/H block 8 (B8). In the present invention, the region including M/H block 3 (B3) and M/H block 8 (B8) will be referred to as "region B (=B3+B8)". As described above, when the data group includes region B having a long known data sequence inserted at only one side (beginning or end) of each M/H block, the receiving system is capable of performing equalization by using the channel information that can be obtained from the known data. Therefore, a stronger equalizing performance as compared to region C/D may be yielded (or obtained).

Referring to FIG. 2, M/H block 2 (B2) and M/H block 9 (B9) correspond to a region having more interference from the main service data as compared to region B. A long known data sequence cannot be inserted in any side of M/H block 2 (B2) and M/H block 9 (B9). Herein, the region including M/H block 2 (B2) and M/H block 9 (B9) will be referred to as "region C (=B2+B9)". Finally, in the example shown in FIG. 2, M/H block 1 (B1) and M/H block 10 (B10) correspond to a region having more interference from the main service data as compared to region C. Similarly, a long known data sequence cannot be inserted in any side of M/H block 1 (B1) and M/H block 10 (B10). Herein, the region including M/H block 1 (B1) and M/H block 10 (B10) will be referred to as "region D (=B1+B10)". Since region C/D is spaced further apart from the known data sequence, when the channel environment undergoes frequent and abrupt changes, the receiving performance of region C/D may be deteriorated.

Additionally, the data group includes a signaling information area wherein signaling information is assigned (or allocated). In the present invention, the signaling information area may start from the $1^{st}$ segment of the $4^{th}$ M/H block (B4) to a portion of the $2^{nd}$ segment. According to an embodiment of the present invention, the signaling information area for inserting signaling information may start from the $1^{st}$ segment of the $4^{th}$ M/H block (B4) to a portion of the $2^{nd}$ segment. More specifically, 276(=207+69) bytes of the $4^{th}$ M/H block (B4) in each data group are assigned as the signaling information area. In other words, the signaling information area consists of 207 bytes of the $1^{st}$ segment and the first 69 bytes of the $2^{nd}$ segment of the $4^{th}$ M/H block (B4). The $1^{st}$ segment of the $4^{th}$ M/H block (B4) corresponds to the $17^{th}$ or $173^{rd}$ segment of a VSB field.

Herein, the signaling data transmitted through the signaling information area may be identified by two different types of signaling channel data: a transmission parameter channel (TPC) data and a fast information channel (FIC) data.

Also, the TPC data includes parameters that are mostly used in a physical layer module. And, since the TPC data are transmitted without being interleaved, the TPC data may be accessed by slot unit in the receiving system. The FIC data are provided in order to enable the receiving system to perform fast service acquisition. Herein, the FIC data include cross layer information between a physical layer and an upper layer. The FIC data are interleaved in sub-frame units and then transmitted.

For example, when the data group includes 6 known data sequences, as shown in FIG. 2, the signaling information area is located between the first known data sequence and the second known data sequence. More specifically, the first known data sequence is inserted in the last 2 segments of the $3^{rd}$ M/H block (B3), and the second known data sequence in inserted in the $2^{nd}$ and $3^{rd}$ segments of the $4^{th}$ M/H block (B4). Furthermore, the $3^{rd}$ to $6^{th}$ known data sequences are respectively inserted in the last 2 segments of each of the $4^{th}$, $5^{th}$, $6^{th}$, and $7^{th}$ M/H blocks (B4, B5, B6, and B7). The $1^{st}$ and $3^{rd}$ to $6^{th}$ known data sequences are spaced apart by 16 segments.

Figure 3:
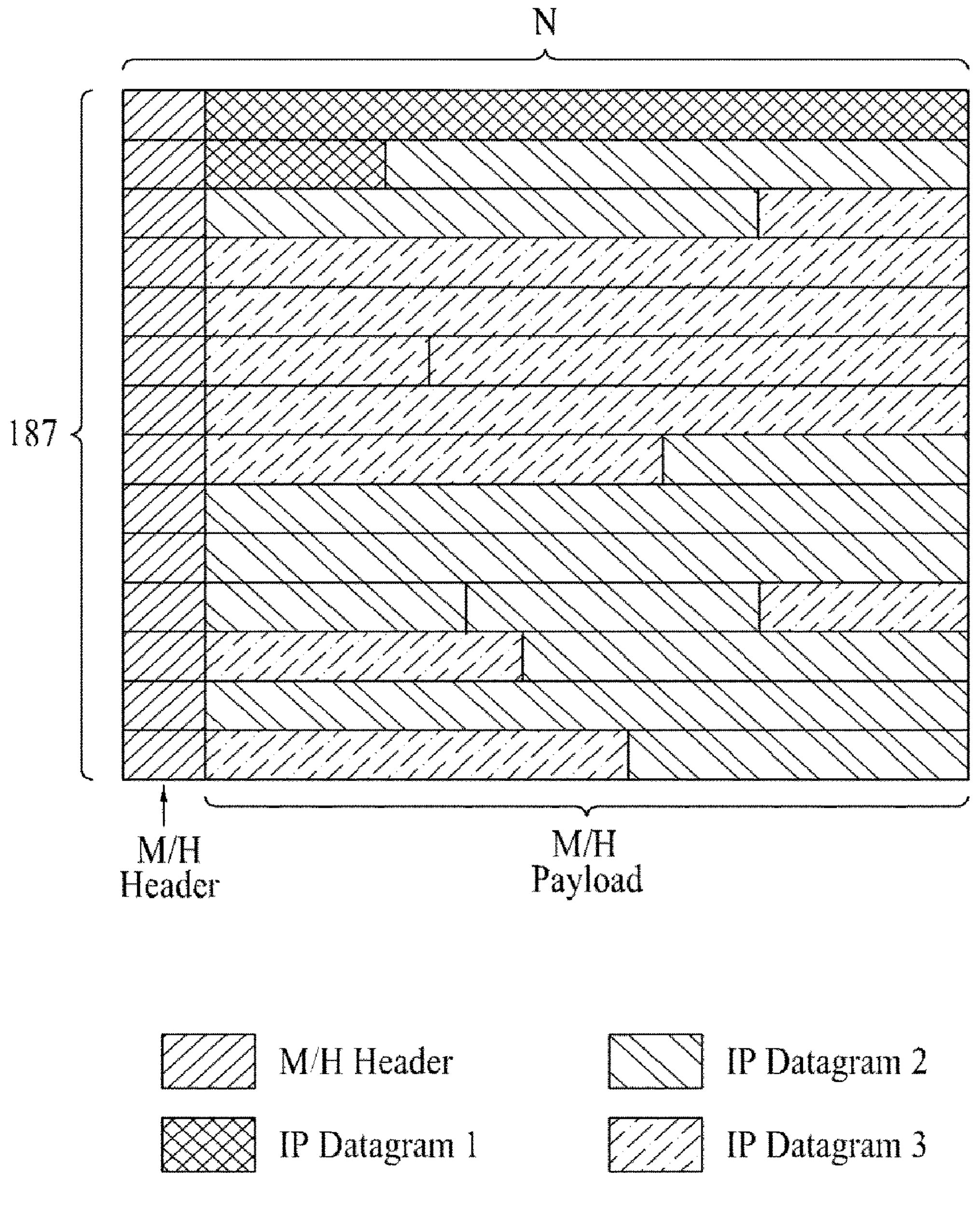
FIG. 3 illustrates an RS frame according to an embodiment of the present invention.

FIG. 3 illustrates an RS frame according to an embodiment of the present invention.

The RS frame is received for each M/H frame in a condition where the receiving system is switched to a time-slicing mode. Each RS frame includes IP streams of each mobile service data or signaling data, and service map table (SMT) section data may exist in all RS frames. The SMT section data may be an IP stream type, or a different data type. The RS frame data is allocated to region corresponding to a plurality of data groups, and transmitted to a receiving system.

The RS frame according to the embodiment of the present invention consists of at least one M/H transport packet (TP). Herein, the M/H TP includes an M/H header and an M/H payload.

The M/H payload may include mobile service data as well as signaling data. More specifically, an M/H payload may include only mobile service data, or may include only signaling data, or may include both mobile service data and signaling data. According to the embodiment of the present invention, the M/H header may identify (or distinguish) the data types included in the M/H payload. More specifically, when the M/H TP includes a first M/H header, this indicates that the M/H payload includes only the signaling data. Also, when the M/H TP includes a second M/H header, this indicates that the M/H payload includes both the signaling data and the mobile service data. Finally, when M/H TP includes a third M/H header, this indicates that the M/H payload includes only the mobile service data. In the example shown in FIG. 3, the RS frame is assigned with an IP datagram (IP datagram 1) for a SMT and IP datagrams (IP datagram 2 and IP datagram 3) for two service types.

Data Transmission Structure

Figure 4:
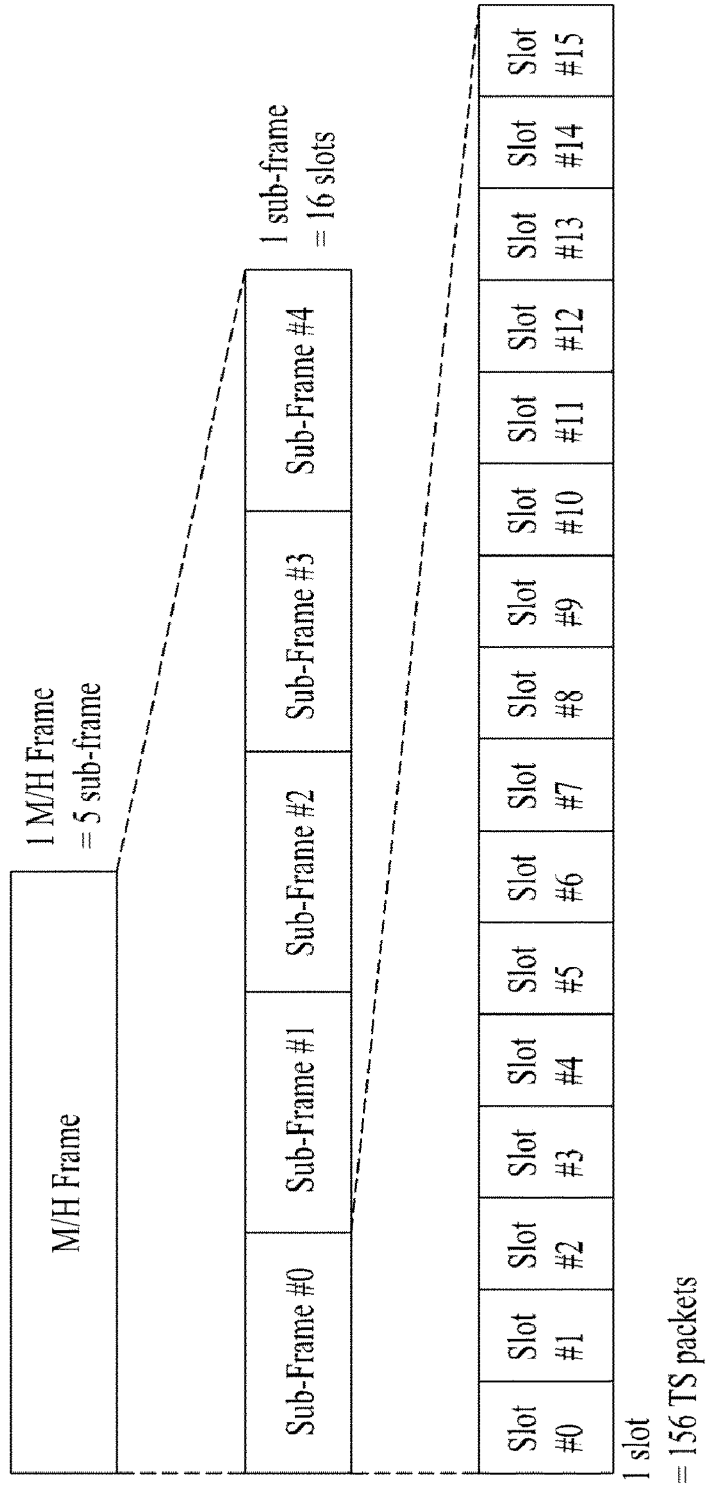
FIG. 4 illustrates an example of an M/H frame structure for transmitting and receiving mobile service data according to the present invention.

FIG. 4 illustrates a structure of an M/H frame for transmitting and receiving mobile service data according to the present invention. In the example shown in FIG. 4, one M/H frame consists of 5 sub-frames, wherein each sub-frame includes 16 slots. In this case, the M/H frame according to the present invention includes 5 sub-frames and 80 slots. Also, in a packet level, one slot is configured of 156 data packets (i.e., transport stream packets), and in a symbol level, one slot is configured of 156 data segments. Herein, the size of one slot corresponds to one half (½) of a VSB field. More specifically, since one 207-byte data packet has the same amount of data as a data segment, a data packet prior to being interleaved may also be used as a data segment. At this point, two VSB fields are grouped to form a VSB frame.

Figure 5:
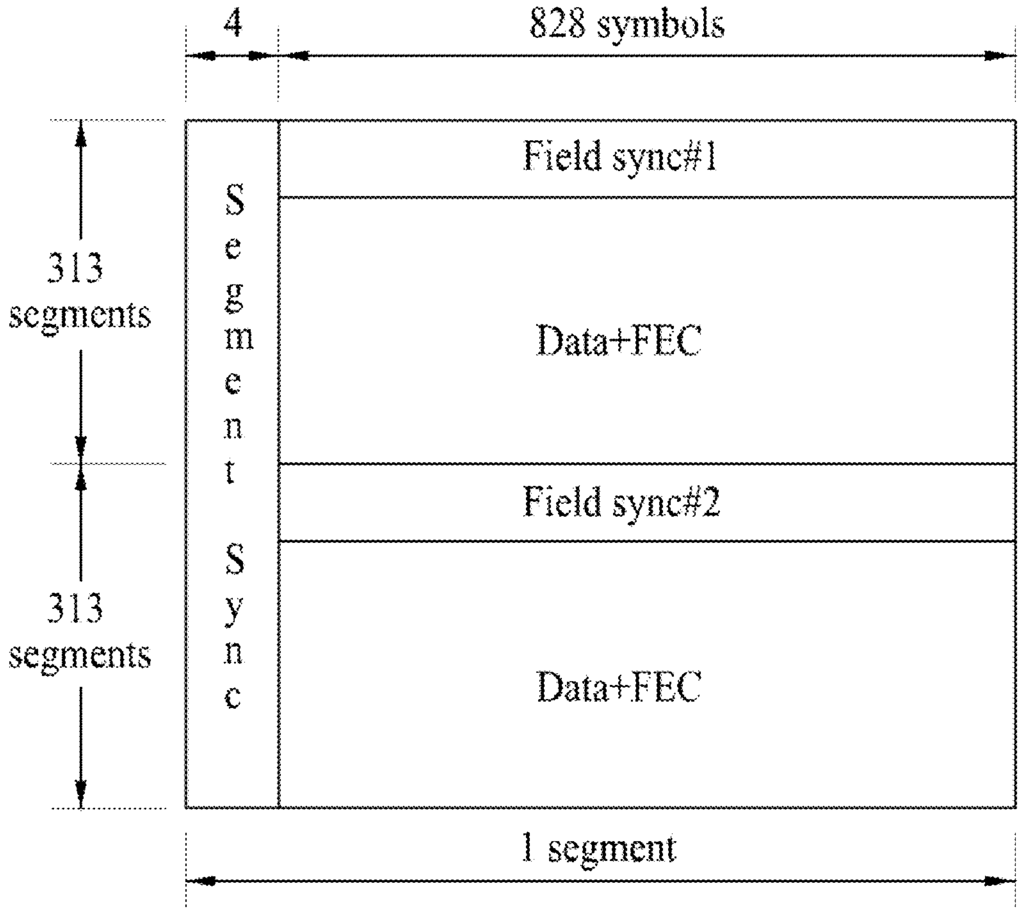
FIG. 5 illustrates an example of a general VSB frame structure.

FIG. 5 illustrates an exemplary structure of a VSB frame, wherein one VSB frame consists of 2 VSB fields (i.e., an odd field and an even field). Herein, each VSB field includes a field synchronization segment and 312 data segments. The slot corresponds to a basic time unit for multiplexing the mobile service data and the main service data.

Herein, one slot may either include the mobile service data or be configured only of the main service data. If the first 118 data packets within the slot correspond to a data group, the remaining 38 data packets become the main service data packets. In another example, when no data group exists in a slot, the corresponding slot is configured of 156 main service data packets.

Meanwhile, the mobile service data within one RS frame may be assigned either to all of regions A/B/C/D within the corresponding data group, or to at least one of regions A/B/C/D. In the embodiment of the present invention, the mobile service data within one RS frame may be assigned either to all of regions A/B/C/D, or to at least one of regions A/B and regions C/D. If the mobile service data are assigned to the latter case (i.e., one of regions A/B and regions C/D), the RS frame being assigned to regions A/B and the RS frame being assigned to regions C/D within the corresponding data group are different from one another.

According to the embodiment of the present invention, the RS frame being assigned to regions A/B within the corresponding data group will be referred to as a "primary RS frame", and the RS frame being assigned to regions C/D within the corresponding data group will be referred to as a "secondary RS frame", for simplicity. Also, the primary RS frame and the secondary RS frame form (or configure) one parade. More specifically, when the mobile service data within one RS frame are assigned either to all of regions A/B/C/D within the corresponding data group, one parade transmits one RS frame. Conversely, when the mobile service data within one RS frame are assigned either to at least one of regions A/B and regions C/D, one parade may transmit up to 2 RS frames. More specifically, the RS frame mode indicates whether a parade transmits one RS frame, or whether the parade transmits two RS frames. Such RS frame mode is transmitted as the TPC data. Table 1 below shows an example of the RS frame mode.

TABLE 1

| RS frame mode (2 bits) | Description |
|---|---|
| 00 | There is only one primary RS frame for all group regions |
| 01 | There are two separate RS frames.<br>Primary RS frame for group regions A and B<br>Secondary RS frame for group regions C and D |
| 10 | Reserved |
| 11 | Reserved |

Table 1 illustrates an example of allocating 2 bits in order to indicate the RS frame mode. For example, referring to Table 1, when the RS frame mode value is equal to '00', this indicates that one parade transmits one RS frame. And, when the RS frame mode value is equal to '01', this indicates that one parade transmits two RS frames, i.e., the primary RS frame and the secondary RS frame. More specifically, when the RS frame mode value is equal to '01', data of the primary RS frame for regions A/B are assigned and transmitted to regions A/B of the corresponding data group. Similarly, data of the secondary RS frame for regions C/D are assigned and transmitted to regions C/D of the corresponding data group.

As described in the assignment of data groups, the parades are also assigned to be spaced as far apart from one another as possible within the sub-frame. Thus, the receiving system can be capable of responding promptly and effectively to any burst error that may occur within a sub-frame. Furthermore, the method of assigning parades may be identically applied to all M/H frames or differently applied to each M/H frame. According to the embodiment of the present invention, the parades may be assigned differently for each M/H frame and identically for all sub-frames within an M/H frame. More specifically, the M/H frame structure may vary by M/H frame units. Thus, an ensemble rate may be adjusted on a more frequent and flexible basis.

That is, the concept of an M/H ensemble is applied in the embodiment of the present invention, thereby defining a collection (or group) of services. Each M/H ensemble carries the same QoS and is coded with the same FEC code. Also, each M/H ensemble has the same unique identifier (i.e., ensemble ID) and corresponds to consecutive RS frames.

Figure 6:
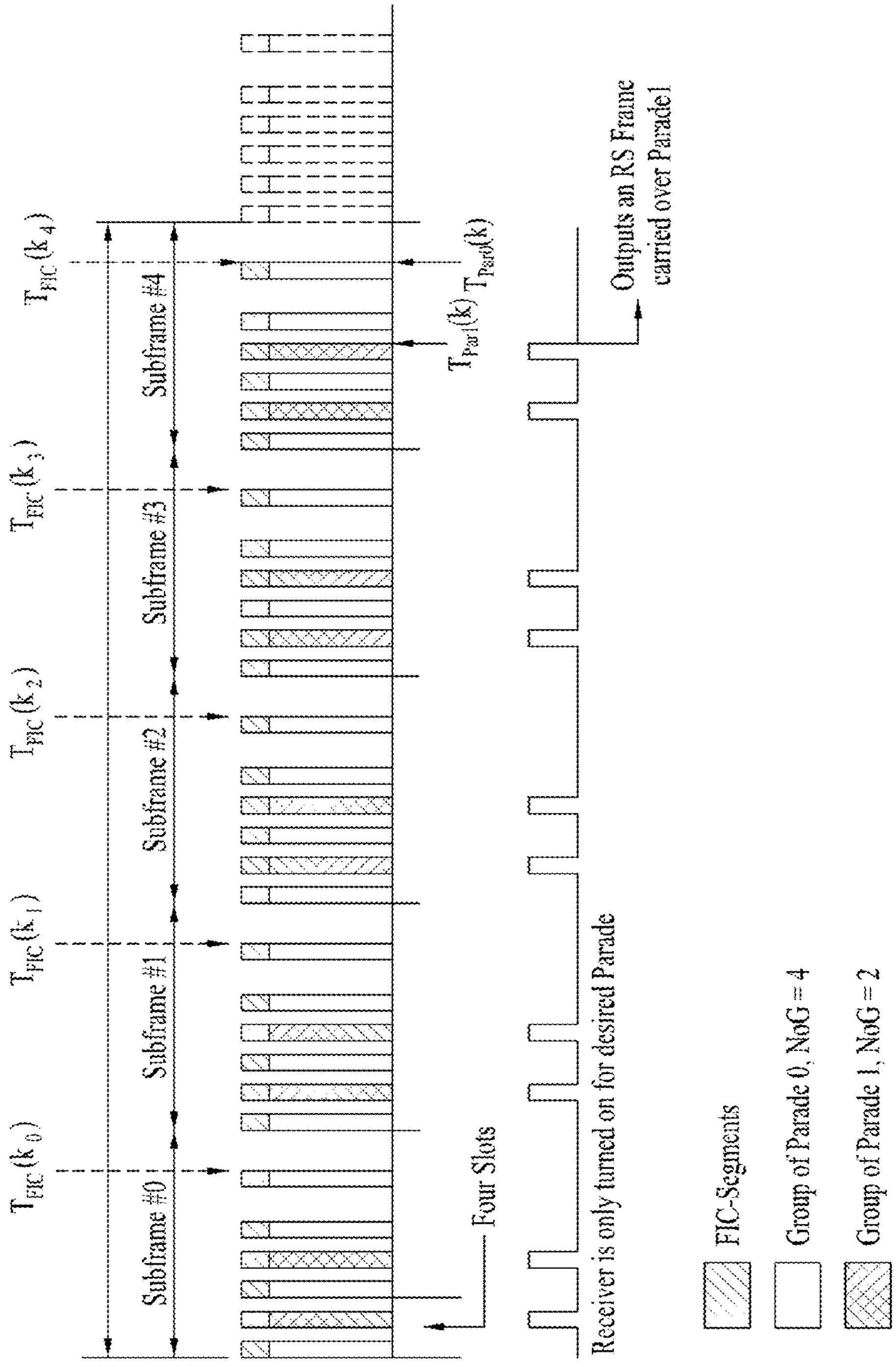
FIG. 6 illustrates a data transmission structure in a physical layer according to an embodiment of the present invention.

FIG. 6 illustrates a data transmission structure in a physical layer according to an embodiment of the present invention. More specifically, FIG. 6 shows an example of FIC data being included in each data group and transmitted. As described above, an M/H frame for approximately 0.968 seconds is divided into 5 sub-frames, wherein data groups corresponding to multiple ensembles exist in combination within each sub-frame. Also, the data groups corresponding to each ensemble are interleaved in M/H frame units, so as to configure an RS frame belonging to one ensemble. In FIG. 6, 2 ensembles (wherein NoG=4 and NoG=3) exist in each sub-frame. Furthermore, a predetermined portion (e.g., 37 bytes/data group) of each data group is used for the purpose of separately delivering encoded FIC data apart from the RS frame data channel. The FIC region assigned to each data group consists of one FIC segment. Herein, each of the FIC segments is interleaved in sub-frame units. For example, RS-encoding and SCCC encoding processes are applied to the RS frame data, and RS encoding and PCCC encoding processes are applied to the FIC data. Also, as well as the FIC data, the RS encoding and PCCC encoding processes are applied to the TPC data. More specifically, (187+P,187)-RS encoding process is applied to the RS frame data, (51,37)-RS encoding process is applied to the FIC data, and (18,10)-RS encoding process is applied to the TPC. Herein, P is the number of parity bytes.

Hierarchical Signaling Structure

Figure 7:
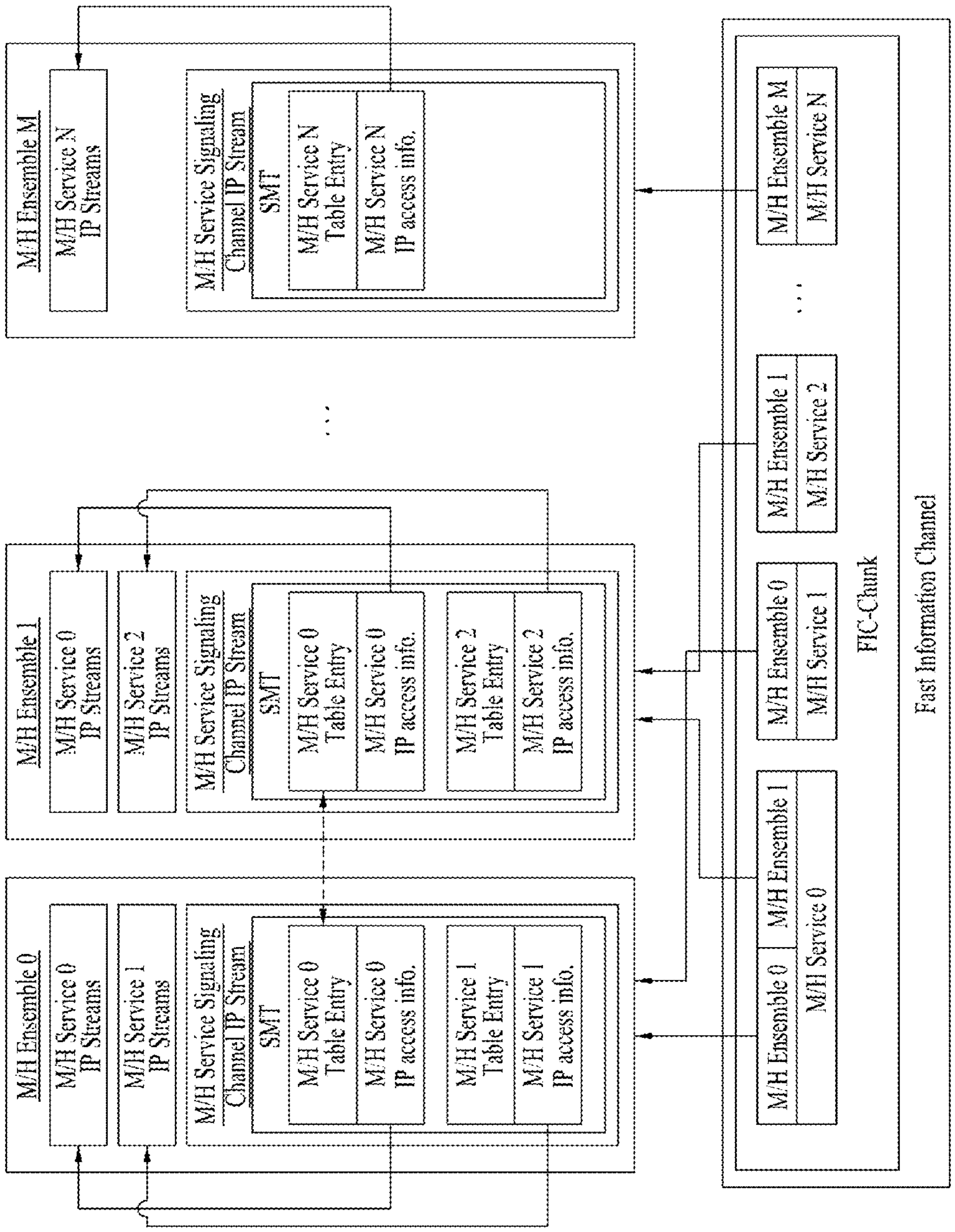
FIG. 7 illustrates a hierarchical signaling structure according to an embodiment of the present invention.

FIG. 7 illustrates a hierarchical signaling structure according to an embodiment of the present invention. As shown in FIG. 7, the mobile broadcasting technology according to the embodiment of the present invention adopts a signaling method using FIC and SMT (Service Map Table). In the description of the present invention, the signaling structure will be referred to as a hierarchical signaling structure. More specifically, FIG. 7 illustrates a hierarchical signaling structure that provides data required for service acquisition through an FIC chunk and a service map table (SMT), among IP-level mobile service signaling channels. As shown in FIG. 7, the FIC chunk uses its fast characteristic, so as to deliver a mapping relation between a service and an ensemble to the receiving system. More specifically, the FIC chunk quickly locates (or finds) an ensemble that can deliver a service requested by the receiving system, thereby providing the receiving system with signaling data that can enable the receiving system to swiftly receive RS frames of a respective ensemble.

Fast Information Channel (FIC)

The receiving system according to the present invention adopts the fast information channel (FIC) for a faster (or swifter) access to a service that is currently being broadcasted.

More specifically, the FIC handler 121 of FIG. 1 configures an FIC chunk from the FIC segments. Then, after parsing the FIC chunk, the FIC handler 121 outputs the parsed result to the service manager 122.

FIG. 8 illustrates a syntax structure of an FIC chunk that maps the relation between a mobile service and an ensemble through the FIC. Herein, the FIC chunk consists of an FIC chunk header and an FIC chunk payload.

FIG. 9 illustrates a syntax structure of an FIC chunk header according to an embodiment of the present invention.

Herein, the FIC chunk header signals a non-backward compatible major protocol version change in a corresponding FIC chunk and also signals a backward compatible minor protocol version change. Furthermore, the FIC chunk header also signals the length for an extension of an FIC chunk header, the length for an extension of an ensemble loop header, and the length for an extension of a mobile service loop that can be generated by a minor protocol version change.

According to an embodiment of the present invention, a receiver (or receiving system) that can adopt the corresponding minor protocol version change may process the corresponding extension field, whereas a legacy (or conventional) receiver that cannot adopt the corresponding minor protocol version change may skip the corresponding extension field by using each of the corresponding length information. For example, in case of a receiving system that can accept the corresponding minor protocol version change, the directions given in the corresponding extension field may be known. Furthermore, the receiving system may perform operations in accordance with the directions given in the corresponding extension field.

According to an embodiment of the present invention, a minor protocol version change in the FIC chunk is performed by inserting additional fields at the respective end portion of the FIC chunk header, the ensemble loop header, and the mobile service loop included in the previous minor protocol version FIC chunk. According to an embodiment of the present invention, in any other case, or when the length of the additional fields cannot be expressed (or indicated) by each extension length within the FIC chunk header, or when a specific field within the FIC chunk payload is missing (or cannot be found), or when the number of bits being assigned to the corresponding field or the definition of the corresponding field is changed (or altered), the major protocol version of the corresponding FIC chunk is updated.

Also, the FIC chunk header signals whether the data of a corresponding FIC chink payload carry mapping information between an ensemble and a mobile service within the current M/H frame, or whether the data of a corresponding FIC chink payload carry mapping information between an ensemble and a mobile service within the next M/H frame. Furthermore, the FIC chunk header also signals the number of transport stream IDs of a mobile service through which the current FIC chunk is being transmitted and the number of ensembles being transmitted through the corresponding mobile service.

Accordingly, for this, the FIC chunk header may include an FIC_major_protocol_version field, an FIC_minor_protocol_version field, an FIC_chunk_header_extension_length field, an ensemble_loop_header_extension_length field, an M/H_service_loop_extension_length field, a current_next_indicator field, a transport_stream_id field, and a num_ensembles field.

The FIC_major_protocol_version field corresponds to a 2-bit unsigned integer field that represents the major version level of an FIC chunk syntax. A change in the major version level shall indicate a change in a non-backward-compatible level. When the FIC_major_protocol_version field is updated, legacy (or conventional) receivers, which can process the prior major version of an FIC chunk protocol, shall avoid processing the FIC chunk.

The FIC_minor_protocol_version field corresponds to a 3-bit unsigned integer field that represents the minor version level of an FIC chunk syntax. When it is assumed that the major version level remains the same, a change in the minor version level shall indicate a change in a backward-compatible level. More specifically, when the FIC_minor_protocol_version field is updated, legacy (or conventional) receivers, which can process the same major version of the FIC chunk protocol, may process a portion of the FIC chunk.

The FIC_Chunk_header_extension_length field corresponds to a 3-bit unsigned integer field identifying the length of FIC chunk header extension bytes, which are generated by the minor protocol version update of the corresponding FIC chunk. Herein, the extension bytes are appended (or added) at the end of the corresponding FIC chunk header.

The ensemble_header_extension_length field corresponds to a 3-bit unsigned integer field identifying the length of the ensemble header extension bytes, which are generated by the minor protocol version update of the corresponding FIC chunk. Herein, the extension bytes are appended (or added) at the end of the corresponding ensemble loop header.

Also, the M/H_service_loop_extension_length field corresponds to a 4-bit unsigned integer field identifying the length of the ensemble header extension bytes, which are generated by the minor protocol version update of the M/H service loop. Herein, the extension bytes are appended (or added) at the end of the corresponding M/H service loop.

The current_next_indicator field corresponds to a 1-bit indicator, which, when set to '1', indicates that the corresponding FIC chunk is currently applicable. Alternatively, when the current_next_indicator field is set to '0', the current_next_indicator field indicates that the corresponding FIC chunk will be applicable for the next M/H frame. Herein, when the current_next_indicator field is set to '0', the most recent version of the FIC chunk being transmitted with the current_next_indicator field set to '1' shall be currently applicable. More specifically, when the current_next_indicator field value is set to '1', this indicates that the corresponding FIC chunk transmits the signaling data of the current M/H frame. Further, when the current_next_indicator field value is set to '0', this indicates that the corresponding FIC chunk transmits the signaling data of the next M/H frame. When reconfiguration occurs, wherein the mapping information between the ensemble within the current M/H frame and the mobile service differs from the ensemble within the next M/H frame and the mobile service, the M/H frame prior to reconfiguration is referred to as the current M/H frame, and the M/H frame following reconfiguration is referred to as the next M/H frame.

The transport_stream_id field corresponds to a 16-bit unsigned integer number field, which serves as a label for identifying the corresponding M/H broadcast. The value of the corresponding transport_stream_id field shall be equal to the value of the transport_stream_id field included in the program association table (PAT) within the MPEG-2 transport stream of a main ATSC broadcast.

The num_ensembles field corresponds to an 8-bit unsigned integer field, which indicates the number of M/H ensembles carried through the corresponding physical transmission channel.

Figure 10:
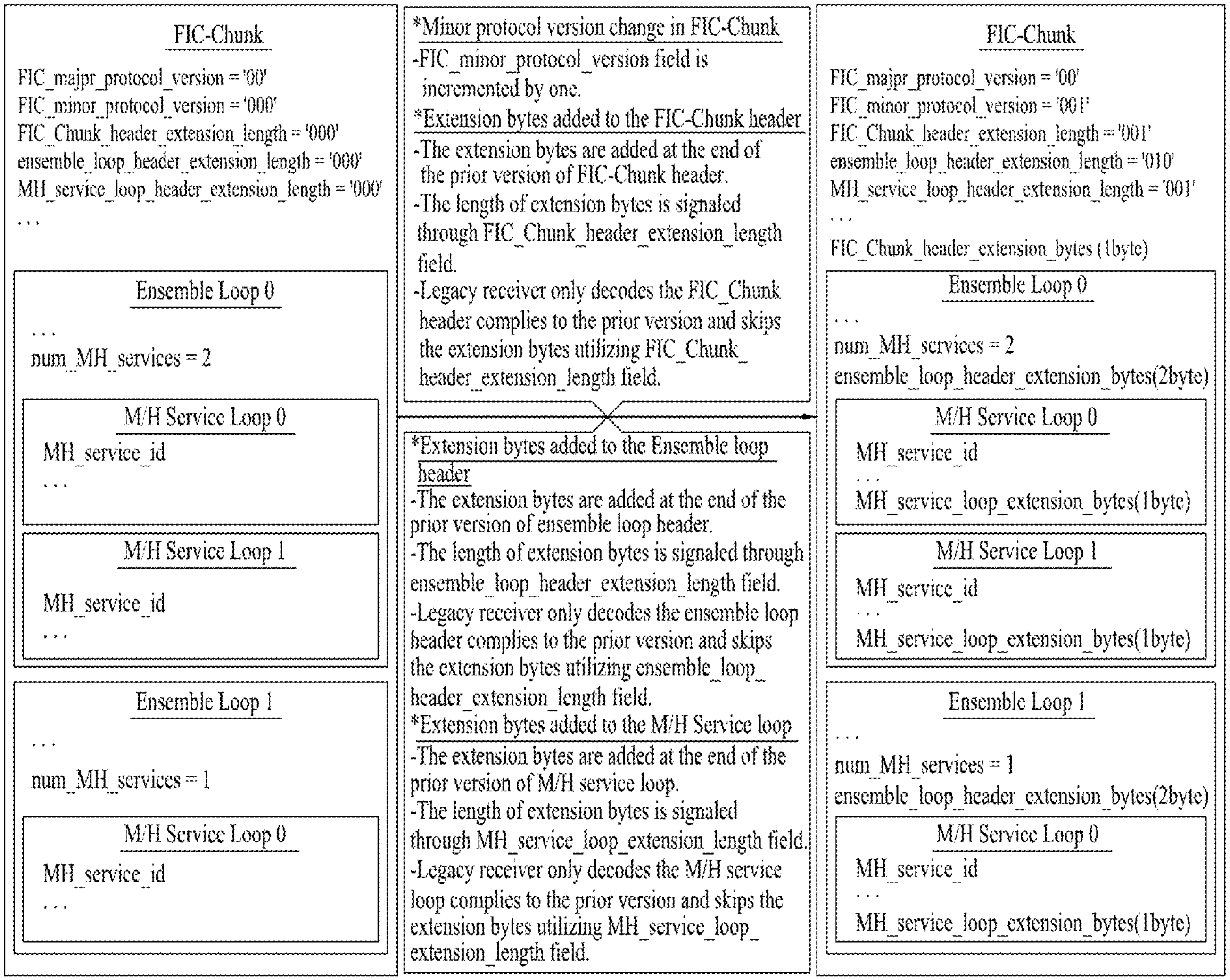
FIG. 10 illustrates an exemplary change in a minor protocol version of a FIC chunk according to the present invention.

FIG. 10 illustrates an exemplary change in a protocol version when using an FIC chunk syntax and a protocol versioning structure according to an embodiment of the present invention.

The structure shown in FIG. 10 includes 2 ensembles (i.e., ensemble 0 and ensemble 1). Herein, two mobile services are transmitted through ensemble 0, and one mobile service is transmitted through ensemble 1. At this point, when the minor protocol version of the FIC chunk is changed, the FIC_minor_protocol_version field value increases, and such increase is indicated. Also, length information for each of the extension bytes of the FIC chunk header, the extension bytes of the ensemble loop header, and the extension bytes of the mobile service loop, which are added by the corresponding minor protocol version is respectively signaled through the FIC-_chunk_header_extension_length field, the ensemble_loop-_header_extension_length field, and the M/H_service-_loop_extension_length field of the FIC chunk header. More specifically, each length information is signaled so that legacy receiver, which cannot adopt the change in the corresponding minor protocol version, can skip the corresponding expansion bytes.

In case of FIG. 10, the FIC_minor_protocol_version field value of the FIC chunk is changed from '000' to '001'. And, the FIC_chunk_header_extension_length field, the ensemble_loop_header_extension_length field, and the M/H_service_loop_extension_length field are added (or appended) to the FIC chunk header of the changed minor protocol version. At this point, when the FIC chunk header is expanded by 1 byte, the FIC_chunk_header_extension_length field is marked as '001'. In this case, a 1-byte expansion field (i.e., FIC_Chunk_header_extension_bytes field) is added at the end of the FIC chunk header. Also, the legacy receiver skips the 1-byte expansion field, which is added at the end of the FIC chunk header, without processing the corresponding expansion field.

Additionally, when the ensemble loop header within the FIC chunk is expanded by 2 bytes, the ensemble_loop_header_extension_length field is marked as '010'. In this case, a 2-byte expansion field (i.e., Ensemble_loop_header_extension_bytes field) is respectively added at the end of the ensemble 0 loop header and at the end of the ensemble 1 loop header. Also, the legacy receiver skips the 2-byte expansion fields, which are respectively added at the end of the ensemble 0 loop header and at the end of the ensemble 1 loop header, without processing the corresponding 2-byte expansion fields.

Furthermore, when the mobile service loop of the FIC chunk is expanded by 1 byte, the M/H_service_loop_extension_length field is marked as '001'. In this case, a 1-byte expansion field (i.e., M/H_service_loop_extension_bytes field) is respectively added at the end of 2 mobile service loops being transmitted through ensemble 0 loop and at the end of 1 mobile service loop being transmitted through the ensemble 1 loop. And, the legacy receiver skips the 1-byte expansion fields, which are respectively added at the end of 2 mobile service loops being transmitted through ensemble 0 loop and at the end of 1 mobile service loop being transmitted through the ensemble 1 loop, without processing the corresponding 1-byte expansion fields.

Figure 11:
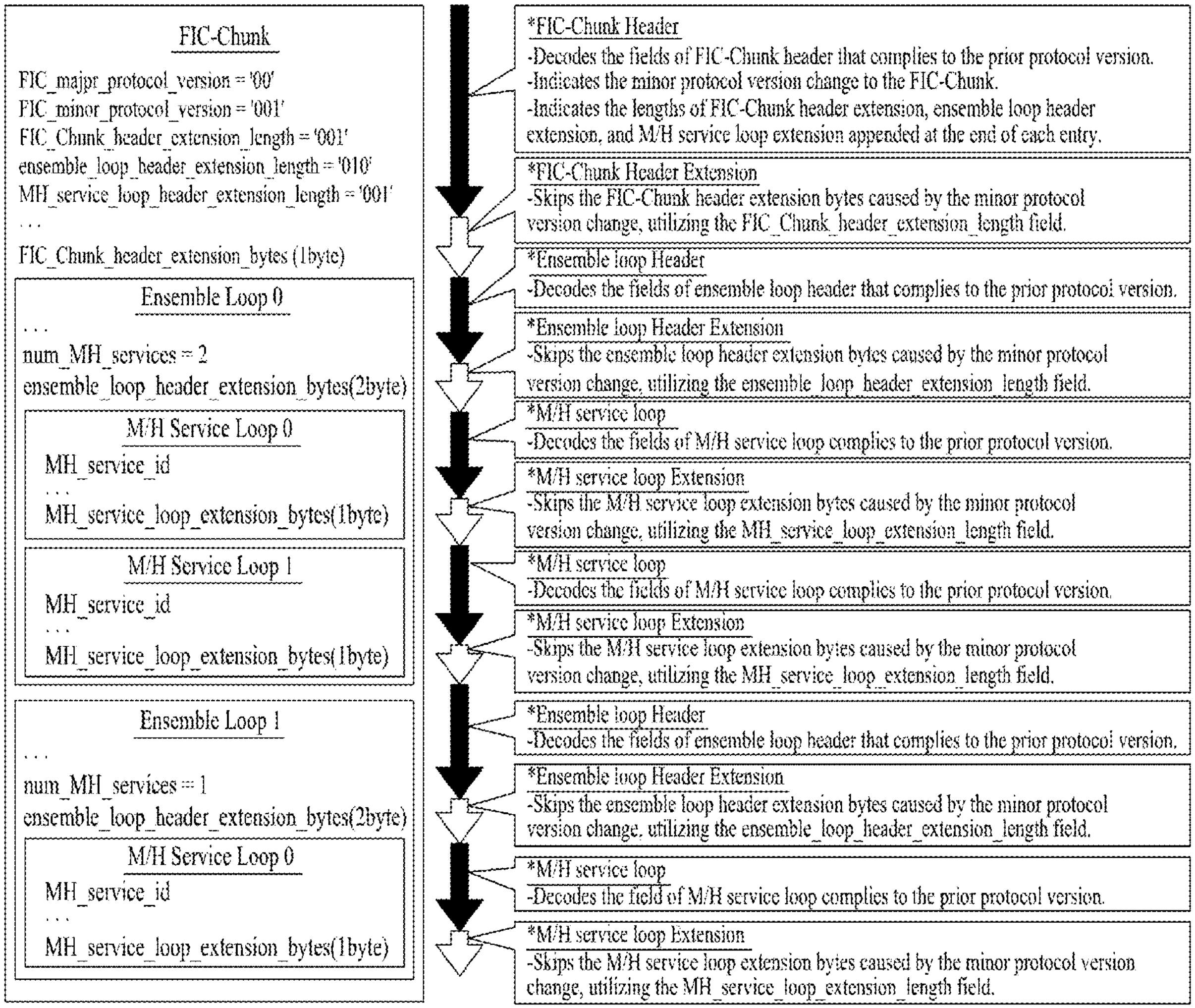
FIG. 11 illustrates an exemplary process of processing an FIC chunk, when a minor protocol version of the FIC chunk is changed according to the present invention.

FIG. 11 illustrates an exemplary process of processing an FIC chunk, when a minor protocol version of the FIC chunk is changed, as shown in FIG. 10. When the FIC_minor_protocol version field is changed, a legacy (or conventional) receiver (i.e., a receiver that cannot adopt the minor protocol version change in the corresponding FIC chunk) processes the fields apart from the extension field. Thereafter, the legacy receiver uses the FIC_chunk_header_extension_length field, the ensemble_loop_header_extension_length field, and the M/H_service_loop_extension_length field, so as to skip the corresponding expansion fields without processing the corresponding fields. When using a receiving system that can adopt the corresponding minor protocol version change of the FIC chunk, each length field is used to process even the corresponding expansion field.

FIG. 12 illustrates an exemplary syntax structure of an FIC chunk payload according to an embodiment of the present invention. For each ensemble corresponding to the num_ensembles field value within the FIC chunk header of FIG. 9, the FIC chunk payload includes configuration information of each ensemble and information on mobile services being transmitted through each ensemble. The FIC chunk payload consists of an ensemble loop and a mobile service loop below the ensemble loop. The FIC chunk payload enables the receiver to determine through which ensemble a requested (or desired) mobile service is being transmitted. (This process is performed via mapping between the ensemble_id field and the M/H_service_id field.) Thus, the receiver may receive RS frames belonging to the corresponding ensemble.

In order to do so, the ensemble loop of the FIC chunk payload may include an ensemble_id field, an ensemble-_structure_major_version field, an ensemble_structure_minor_version field, an SLT_ensemble_indicator field, a GAT-_ensemble_indicator field, an M/H_service_configuration_version field, and a num_M/H_services field, which are collectively repeated as many times as the num_ensembles field value. The mobile service loop may include a multi_ensemble_service field, an M/H_service_status field, and an SP_indicator field, which are collectively repeated as many times as the num_M/H_services field.

The ensemble_id field corresponds to an 8-bit unsigned integer field, which indicates a unique identifier of the corresponding ensemble. For example, the ensemble_id field may be assigned with values within the range '0x00' to '0x7F'. The ensemble_id field group (or associate) the mobile services with the respective ensemble. Herein, it is preferable that the value of the ensemble_id field is derived from the parade_id field carried (or transmitted) through the TPC data. If the corresponding ensemble is transmitted through a primary RS frame, the most significant bit is set to '0', and the remaining least significant bits are used as the parade_id field value of the corresponding parade. Meanwhile, if the corresponding ensemble is transmitted through a secondary RS frame, the most significant bit is set to '0', and the remaining least significant bits are used as the parade_id field value of the corresponding parade.

The ensemble_major_protocol_version field corresponds to a 2-bit unsigned integer field, which represents the major level version of the corresponding ensemble structure (particularly, the corresponding RS frame structure and mobile service structure). Herein, a change in the major protocol version level shall indicate a change in a non-backward-compatible level.

The ensemble_minor_protocol_version field corresponds to a 3-bit unsigned integer field, which represents the minor level version of the corresponding ensemble structure (particularly, the respective RS frame structure and the respective M/H service signaling channel). Provided that the major version level remains the same, a change in the minor protocol version level shall indicate a change in a backward-compatible level. Herein, the ensemble_structure_major_version field and the ensemble_structure_minor_version field may be omitted from the FIC chunk payload.

The SLT_ensemble_indicator field corresponds to a 1-bit indicator, which, when set to '1', shall indicate that the service labeling table (SLT) is carried in the M/H service signaling channel of the corresponding ensemble.

The GAT_ensemble_indicator corresponds to a 1-bit indicator, which, when set to '1', shall indicate that the guide access table (GAT) is carried in the signaling stream of the corresponding ensemble.

The M/H_service_configuration_version field corresponds to a 5-bit field, which indicates the version number of the M/H service signaling channel respective of the corresponding M/H ensemble. The value of the M/H_service_configuration_version field is 'modulo 32' and shall be incremented (or increased) by 1, whenever a change is made in any of the tables carried within the M/H service signaling channel of the corresponding ensemble.

The num_M/H_services field corresponds to an 8-bit unsigned integer field, which represents the number of M/H services carried through the corresponding M/H ensemble. For example, when the minor protocol version of the FIC chunk is change, and if an expansion field is added to the ensemble loop header, the expansion field is added after the num_M/H_services field.

For example, when the minor protocol version within the FIC chunk header is changed, and when an extension field is added to the ensemble loop header, the extension field is added immediately after the num_M/H_services field. According to anther embodiment of the present invention, if the num_M/H_services field is included in the mobile service loop, the extension field that is to be added in the ensemble loop header is added immediately after the M/H_service_configuration_version field.

The M/H_service_id field of the mobile service loop corresponds to a 16-bit unsigned integer number, which identifies the corresponding M/H service. The value (or number) of the M/H_service_id field shall be unique within the mobile (M/H) broadcast. When an M/H service has components in multiple M/H ensembles, the set of IP streams corresponding to the service in each ensemble shall be treated as a separate service for signaling purposes, with the exception that the entries for the corresponding services in the FIC shall all have the same M/H_service_id field value. Thus, the same M/H_service_id field value may appear in more than one num_ensembles loop. And, accordingly, the M/H_service_id field shall represent the overall combined service, thereby maintaining the uniqueness of the M/H_service_id field value.

The multi_ensemble_service field corresponds to a 2-bit enumerated field, which identifies whether or not the corresponding M/H service is carried through more than one M/H ensemble. Also, the multi_ensemble_service field identifies whether or not the M/H service can be rendered meaningfully with only a portion of the M/H service being carried through the corresponding M/H ensemble.

The M/H_service_status field corresponds to a 2-bit enumerated field, which identifies the status of the corresponding M/H service. For example, the most significant bit of the M/H_service_status field indicates whether the corresponding M/H service is active (when set to ‘1’) or inactive (when set to ‘0’). Furthermore, the least significant bit indicates whether the corresponding M/H service is hidden (when set to ‘1’) or not (when set to ‘0’). The SP_indicator field corresponds to a 1-bit field, which, when set to ‘1’, indicates whether or not service protection is applied to at least one of the components required for providing a significant presentation of the corresponding M/H service.

For example, when the minor protocol version of the FIC chunk is change, and if an expansion field is added to the mobile service loop, the expansion field is added after the SP_indicator field.

Also, the FIC chunk payload may include an FIC_chunk_stuffing( ) field. Stuffing of the FIC_chunk_stuffing( ) field may exist in an FIC-Chunk, to keep the boundary of the FIC-Chunk to be aligned with the boundary of the last FIC-Segment among FIC segments belonging to the FIC chunk. The length of the stuffing is determined by how much space is left after parsing through the entire FIC-Chunk payload preceding the stuffing.

Figure 13:
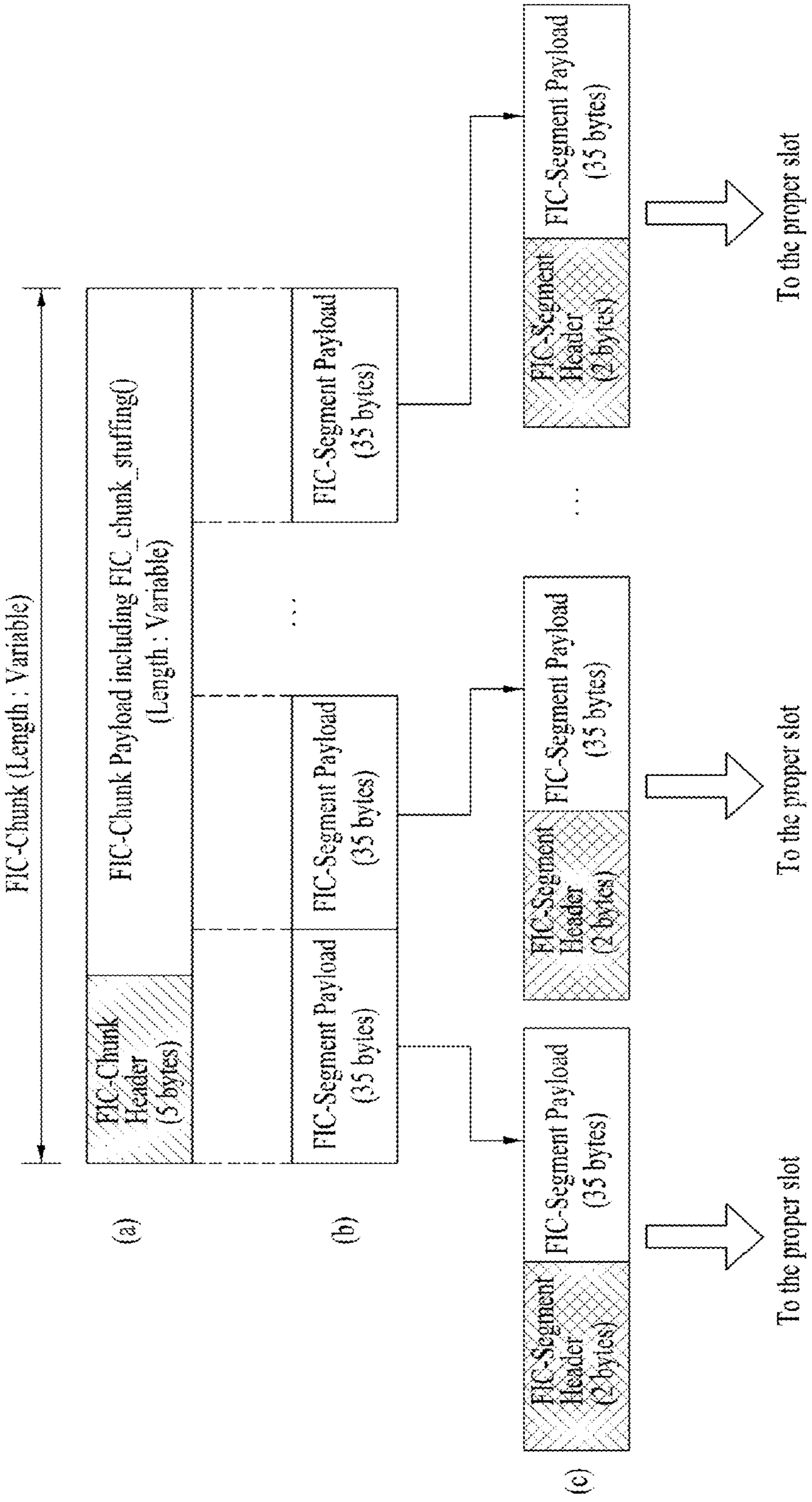
FIG. 13 illustrates an example of segmentation process of a FIC chunk according to the present invention.

At this point, the transmitting system (not shown) according to the present invention divides the FIC chunk into multiple FIC segments, as shown in FIG. 13, thereby outputting the divided FIC segments to the receiving system in FIC segment units. The size of each FIC segment unit is 37 bytes, and each FIC segment consists of a 2-byte FIC segment header and a 35-byte FIC segment payload. More specifically, an FIC chunk, which is configured of an FIC chunk header and an FIC chunk payload, as shown in FIG. 13(*a*), is segmented by units of 35 bytes, as shown in FIG. 13(*b*). Also, as shown in FIG. 13(*c*), an FIC segment is configured by adding a 2-byte FIC segment header in front of each segmented 35-byte unit.

According to an embodiment of the present invention, the length of the FIC chunk payload is variable. Herein, the length of the FIC chunk varies depending upon the number of ensembles being transmitted through the corresponding physical transmission channel and the number of mobile services included in each ensemble.

Also, the FIC chunk payload may include stuffing data. In this case, the stuffing data are used for the boundary alignment of the FIC chunk and the last FIC-Segment, among FIC segments belonging to the FIC chunk, according to the embodiment of the present invention. Accordingly, by minimizing the length of the stuffing data, unnecessary wasting of FIC segments can be reduced.

At this point, the number of stuffing data bytes being inserted in the FIC chunk can be calculated by using Equation 1 below.

$$\text{The number of stuffing data bytes}=35-j \qquad \text{Equation 1}$$

j=(5+the number of signaling data bytes being inserted in the FIC chunk payload) mod 35

For example, when the added total length of the 5-byte header within the FIC chunk and signaling data, which is to be inserted in the payload within the FIC chunk, is equal to 205 bytes, the payload of the FIC chunk may include 5 bytes of stuffing data because j is equal to 30 in Equation 1. Also, the length of the FIC chunk payload including the stuffing data is equal to 210 bytes. Thereafter, the FIC chunk is divided into 6 FIC segments, which are then transmitted. At this point, a segment number is sequentially assigned to each of the 6 FIC segments divided from the FIC chunk.

Figure 14:
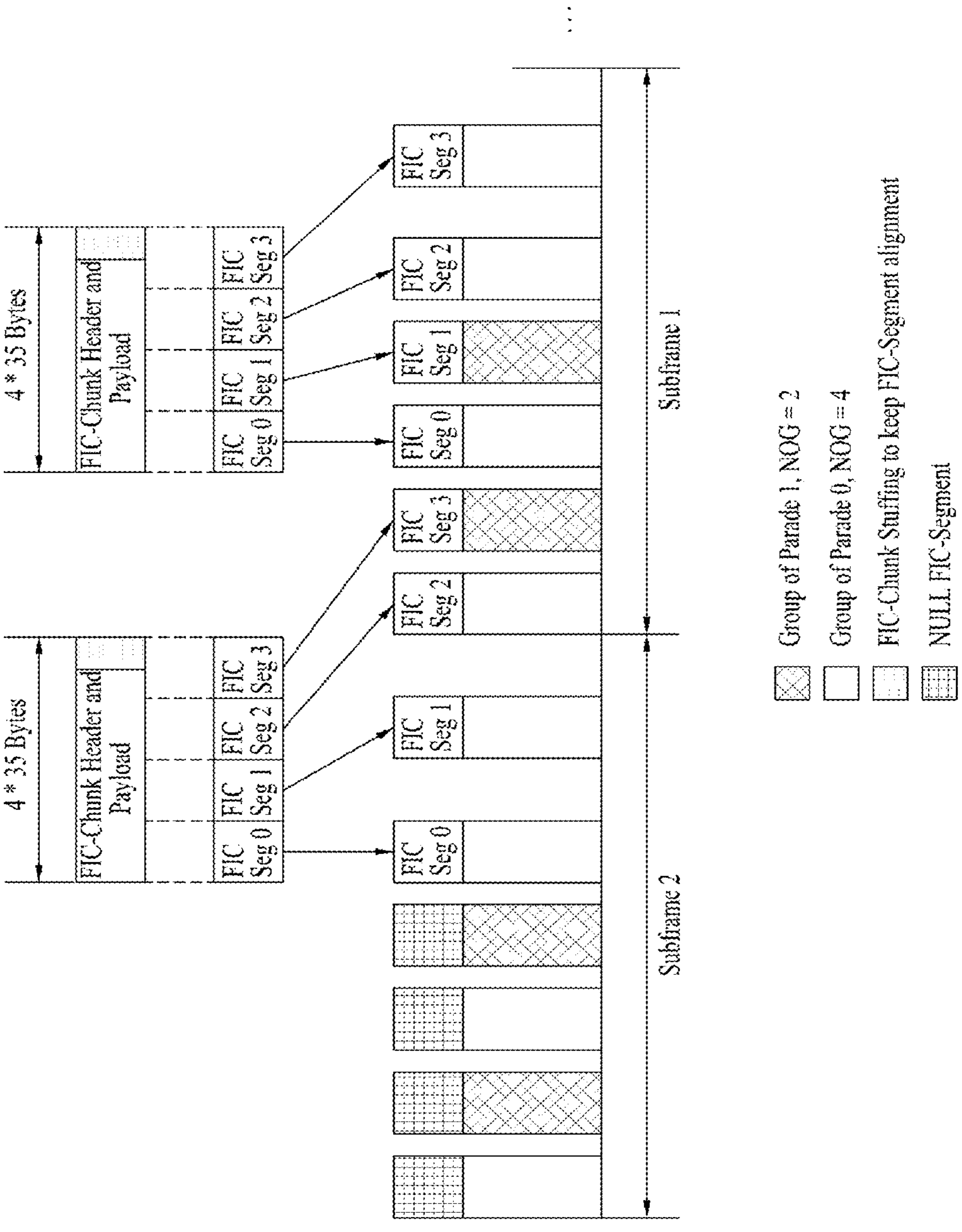
FIG. 14 illustrates FIC segments transmitted according to an embodiment of the present invention.

Furthermore, the present invention may transmit the FIC segments divided from a single FIC chunk to a single subframe, or may transmit the divided FIC segments to multiple sub-frames, as shown in FIG. 14. If the FIC chunk is divided and transmitted to multiple sub-frames, as in the latter case shown in FIG. 14, signaling data, which are required even when the amount of data that are to be transmitted through the FIC chunk is larger than the amount of FIC segments being transmitted through a single sub-frame (this case corresponds to when multiple services having very low bit rates are being executed), may all be transmitted through the FIC chunk.

FIG. 14 illustrates an example of the data of the FIC chunk being transmitted through 4 FIC segments, when the TNoG of the corresponding mobile broadcast is equal to ‘6’.

More specifically, FIG. 14 shows an example of the FIC chunk being repeatedly transmitted two times. Referring to FIG. 14, all FIC segments divided from the FIC chunk are transmitted through 2 sub-frames (subframe 1 and subframe 2), and all FIC segments divided from the FIC chunk are transmitted through only one (subframe 1) of the 2 subframes. More specifically, the present invention indicates that multiple FIC chunk can be transmitted through a single subframe. In FIG. 14, the content of the 2 FIC chunks may be identical to one another or may be different from one another.

Herein, the FIC segment numbers indicated in FIG. 14 represent FIC segment numbers within each FIC chunk, and not the FIC segment number within each sub-frame. Thus, the subordinate relation between the FIC chunk and the sub-frame can be eliminated, thereby reducing excessive waste of FIC segments.

Furthermore, the present invention may add a null FIC segment. Despite the repeated transmission of the FIC chunk, and when stuffing is required in the corresponding M/H frame, the null FIC segment is used for the purpose of processing the remaining FIC segments. For example, it is assumed that TNoG is equal to '3' and that the FIC chunk is divided into 2 FIC segments. Herein, when the FIC chunk is repeatedly transmitted through 5 sub-frames within a single M/H frame, only 2 FIC segments are transmitted through one of the 5 sub-frames (e.g., the sub-frame chronologically placed in the last order). In this case, one null FIC segment is assigned to the corresponding sub-frame, thereby being transmitted. More specifically, the null FIC segment is used for aligning the boundary of the FIC chunk and the boundary of the M/H frame. At this point, since the null FIC segment is not an FIC segment divided from the FIC chunk, an FIC segment number is not assigned to the null FIC segment.

In the present invention, when a single FIC chunk is divided into a plurality of FIC segments, and when the divided FIC segments are included in each data group of at least one sub-frame within the M/H frame, so as to be transmitted, the corresponding FIC segments are allocated in a reversed order starting from the last sub-frame within the corresponding M/H frame. According to an embodiment of the present invention, in case a null FIC segment exists, the null FIC segment is positioned in the sub-frame within the M/H frame, so that the corresponding null FIC segment can be transmitted as the last (or final) segment.

Figure 15:
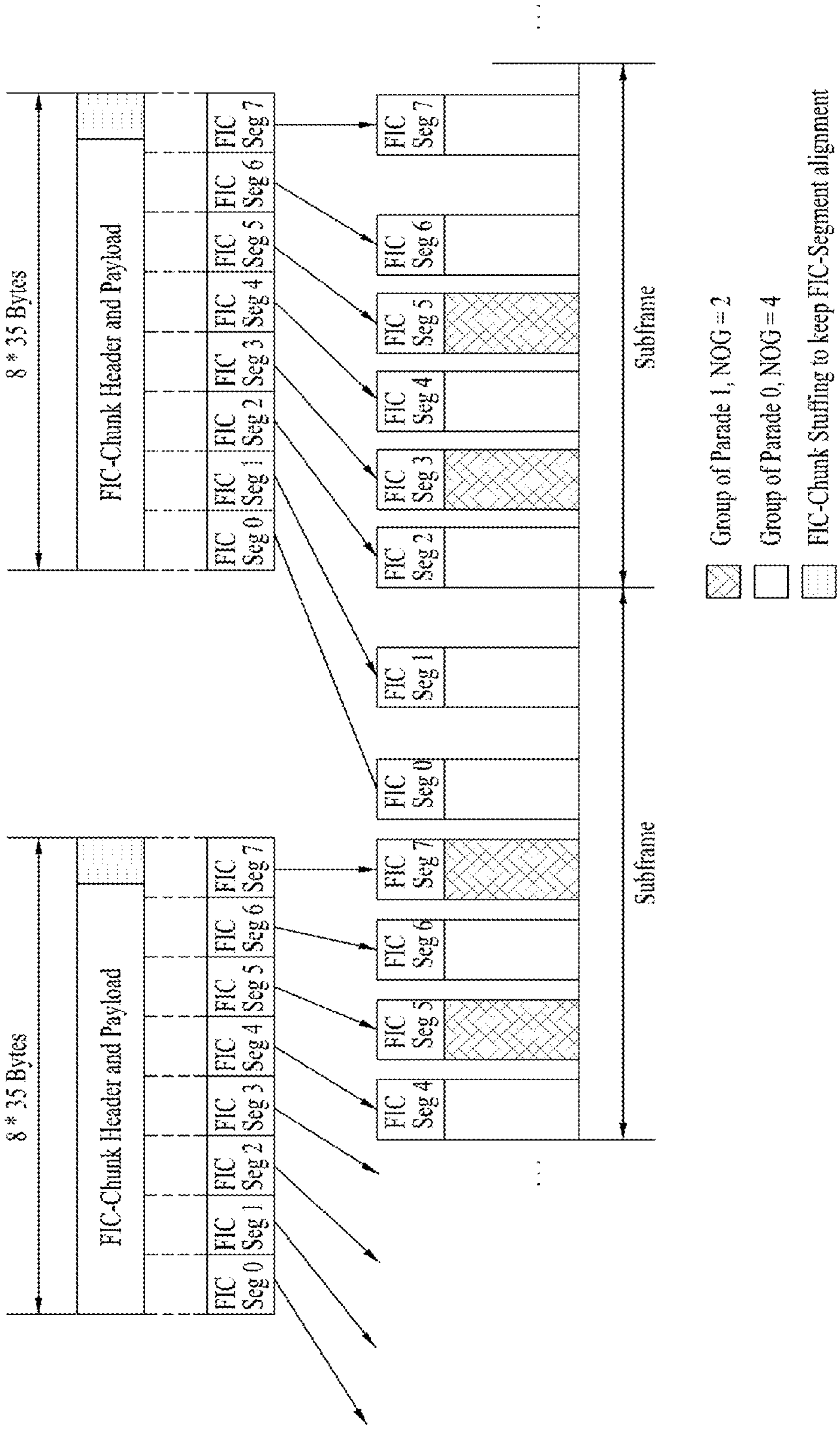
FIG. 15 illustrates FIC segments transmitted according to another embodiment of the present invention.

FIG. 15 illustrates an example of the data of the FIC chunk being transmitted through 8 FIC segments, when the TNoG of the corresponding mobile broadcast is equal to '6'. In this case, the amount of data that are to be transmitted through the FIC chunk is larger than the amount of FIC segments being transmitted through a single sub-frame. Herein, since the FIC segments divided from the FIC chunk are transmitted through 2 sub-frames, as shown in FIG. 15, all of the required signaling data may be transmitted through a single FIC chunk. Also, in this case, the number assigned to each FIC segment corresponds to the number of each FIC segment included in the FIC chunk. More specifically, even when the amount of FIC chunk data is larger than the amount of FIC segment data being transmitted through a single sub-frame, all FIC chunk data are transmitted without leaving any non-transmitted data portion.

At this point, in order to enable the receiving system to discard the null FIC segment without having to process the corresponding null FIC segment, identification information that can identify (or distinguish) the null FIC segment is required.

According to an embodiment of the present invention, the present invention uses the FIC_type field within the header of the null FIC segment as the identification information for identifying the null FIC segment. In this embodiment, the value of the FIC_type field within the null FIC segment header is set to '11', so as to identify the corresponding null FIC segment. More specifically, when the FIC_type field value within the null FIC segment header is set to '11' and transmitted to the receiving system, the receiving system may discard the payload of the FIC segment having the FIC_type field value set to '11' without having to process the corresponding FIC segment payload. Herein, the value '11' is merely an exemplary value given to facilitate and simplify the understanding of the present invention. As long as a pre-arrangement between the receiving system and the transmitting system is established, any value that can identify the null FIC segment may be given to the FIC_type field. Therefore, the present invention will not be limited only to the example set presented herein. Furthermore, the identification information that can identify the null FIC segment may also be indicated by using another field within the FIC segment header.

FIG. 16 illustrates an exemplary syntax structure of an FIC segment header according to an embodiment of the present invention. Herein, the FIC segment header may include an FIC_type field, an error_indicator field, an FIC_segment_num field, and an FIC_last_segment_num field. Each field will now be described as follows.

The FIC_type field corresponds to a 2-bit field, which, when set to '00' indicates that the corresponding FIC segment is carrying a portion of an FIC chunk. Alternatively, when the FIC_type field is set to '11', the FIC_type field indicates that the corresponding FIC segment is a null FIC segment, which transmits stuffing data. Herein, the remaining values are reserved for future use.

The error_indicator field corresponds to a 1-bit field, which indicates whether or not an error has occurred in the corresponding FIC segment during transmission. Herein, the error_indicator field is set to '1', when an error has occurred. And, the error_indicator field is set to '0', when an error does not exist (or has not occurred). More specifically, during the process of configuring the FIC segment, when a non-recovered error exists, the error_indicator field is set to '1'. More specifically, the error_indicator field enables the receiving system to recognize the existence (or presence) of an error within the corresponding FIC segment.

The FIC_segment_num field corresponds to a 4-bit unsigned integer number field, which indicates a number of the corresponding FIC segment. For example, if the corresponding FIC segment is the first FIC segment of the FIC chunk, the value of the FIC_segment_num field shall be set to '0x0'. Also, if the corresponding FIC segment is the second FIC segment of the FIC chunk, the value of the FIC_segment_num field shall be set to '0x1'. More specifically, the FIC_segment_num field shall be incremented by one with each additional FIC segment in the FIC chunk. Herein, if the FIC chunk is divided into 4 FIC segments, the FIC_segment_num field value of the last FIC segment within the FIC chunk will be indicated as '0x3'.

The FIC_last_segment_num field corresponds to a 4-bit unsigned integer number field, which indicates the number of the last FIC segment (i.e., the FIC segment having the highest FIC_segment_num field value) within a complete FIC chunk.

In the conventional method, FIC segment numbers are sequentially assigned (or allocated) for each FIC segment within one sub-frame. Therefore, in this case, the last FIC segment number always matches with the TNoG (i.e., the last FIC segment number is always equal to the TNoG). However, when using the FIC number assignment method according to the present invention, the last FIC segment number may not always match with the TNoG. More specifically, the last FIC segment number may match with the TNoG, or the last FIC segment number may not match with the TNoG. The TNoG represents a total number of data groups that are allocated (or assigned) to a single sub-frame. For example, when the TNoG is equal to '6', and when the FIC chunk is divided into 8 FIC segments, the TNoG is equal to '6', and the last FIC segment number is '8'.

According to another embodiment of the present invention, the null FIC segment may be identified by using the value of the FIC_segment_num field within the FIC segment header. More specifically, since an FIC segment number is not assigned to the null FIC segment, the transmitting system allocates null data to the FIC_segment_num field value of the null FIC segment, and the receiving system may allow the FIC segment having null data assigned to the FIC_segment_num field value to be recognized as the null FIC segment. Herein, instead of the null data, data pre-arranged by the receiving system and the transmitting system may be assigned to the FIC_segment_num field value, instead of the null data.

As described above, the FIC chunk is divided into a plurality of FIC segments, thereby being transmitted through a single sub-frame or being transmitted through multiple sub-frames. Also, FIC segments divided from a single FIC chunk may be transmitted through a single sub-frame, or FIC segments divided from multiple single FIC chunks may be transmitted through a single sub-frame. At this point, the number assigned to each FIC segment corresponds to a number within the corresponding FIC chunk (i.e., the FIC_seg_number value), and not the number within the corresponding sub-frame. Also, the null FIC segment may be transmitted for aligning the boundary of the M/H frame and the boundary of the FIC chunk. At this point, an FIC segment number is not assigned to the null FIC segment.

As described above, one FIC chunk may be transmitted through multiple sub-frames, or multiple FIC chunks may be transmitted through a single sub-frame. However, according to the embodiment of the present invention, the FIC segments are interleaved and transmitted in sub-frame units.

Figure 17:
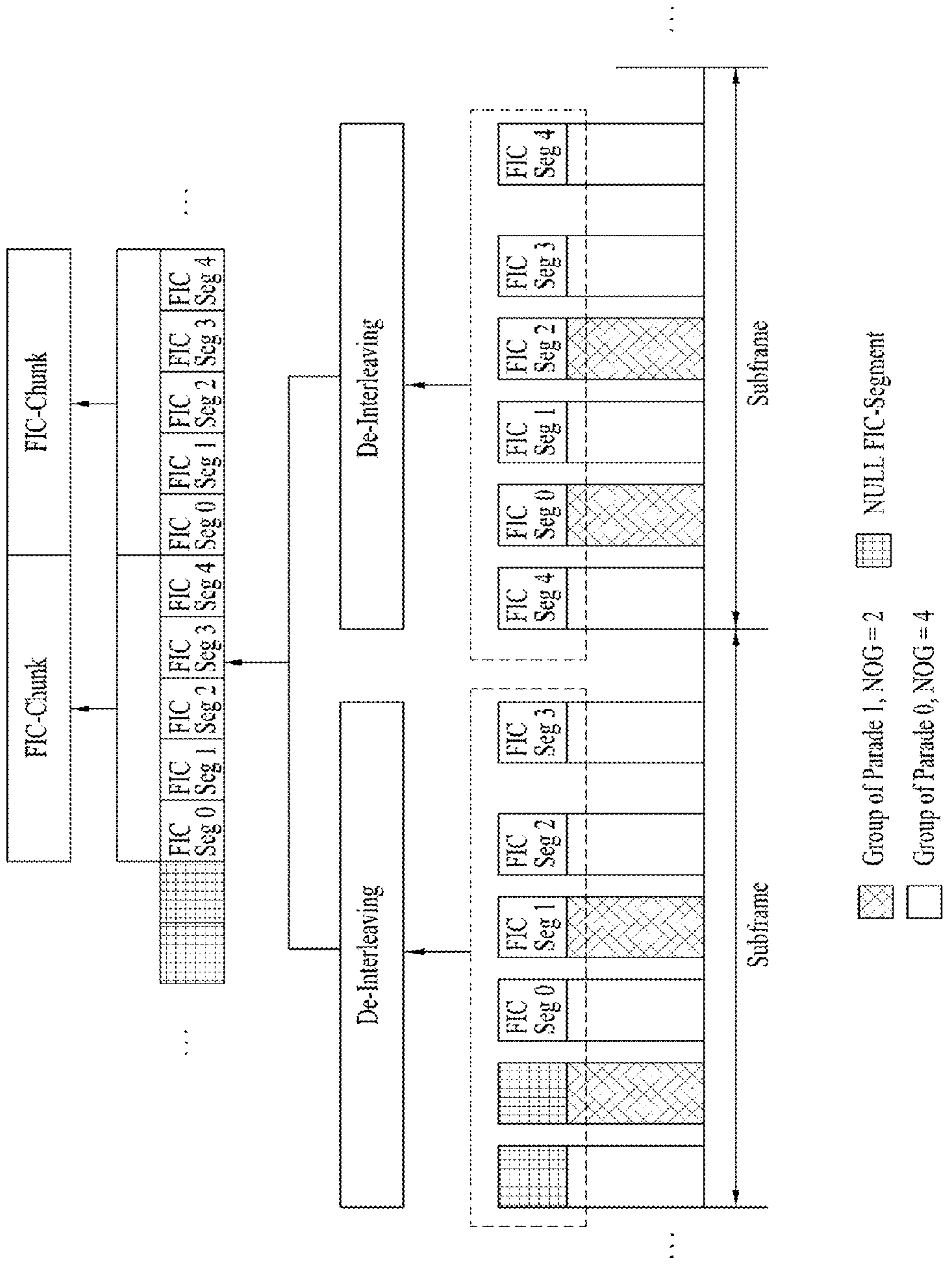
FIG. 17 illustrates an example of recovering (or obtaining) one or more FIC chunks by receiving FIC segments according to the present invention.

FIG. 17 illustrates an example of the receiving system receiving and recovering one or more FIC chunks, either when a single FIC chunk is transmitted through multiple sub-frames, or when multiple FIC chunks are transmitted through a single sub-frame as shown in FIG. 13 to FIG. 15.

More specifically, the signaling decoder 118 of the receiving system according to the present invention collects FIC data of a signaling information region within a data group for each sub-frame, so as to interleave the collected data in sub-frame units. Thereafter, the signaling decoder 118 performs RS-decoding on the deinterleaved FIC segment, thereby outputting the RS-decoded data to the FIC handler 121. The FIC segment buffer of the FIC handler 121 temporarily stores the RS-decoded FIC segment and then outputs the temporarily stored FIC segment to the FIC segment parser. The FIC segment parser extracts and analyzes an FIC segment header. Subsequently, based upon the analyzed result, the FIC segment parser collects FIC segments, which configure a single FIC chunk. Thereafter, the FIC segment parser removes (or discards) the FIC segment header of the collected FIC segments, thereby recovering (or configuring) a single FIC chunk.

For example, the FIC segment parser uses the FIC_segment_num field and the FIC_last_segment_num field within the FIC segment header in order to collect FIC segments, which configure one FIC chunk. The recovered FIC chunk is then outputted to the FIC chunk parser. The FIC chunk parser extracts and analyzes a header of the FIC chunk that is being inputted. Then, based upon the analyzed result, the FIC chunk parser extracts signaling data, which are included in the payload of the corresponding FIC chunk, thereby outputting the extracted signaling data to the service manager 122.

More specifically, the FIC segment parser extracts and analyzes a header of an FIC segment that is buffered and then inputted. Thereafter, the FIC segment parser searches for (or locates) an FIC segment having the FIC_segment_num field value of ‘0’ (i.e., an FIC segment including a first byte of the FIC chunk data). Once the FIC segment parser locates the first FIC segment of the FIC chunk, the FIC segment parser sequentially collects data starting from the first FIC segment to the FIC segment having the same FIC_segment_num field value and FIC_last_segment_num field value. Thereafter, the FIC segment parser removes the FIC segment headers of the collected FIC segments, so as to configure an FIC chunk, thereby outputting the configured FIC chunk to the FIC chunk parser.

For example, it is assumed that the TNoG of the corresponding mobile broadcast is equal to ‘6’, as shown in FIG. 17, and that the FIC chunk is divided into 5 FIC segments so as to be transmitted. Referring to FIG. 17, either the FIC segments of one FIC chunk are transmitted through 2 sub-frames, or the FIC segments of 2 FIC chunks are transmitted to one sub-frame. However, it is apparent that the deinterleaving process is performed in sub-frame units. Also, 5 FIC segments starting from the FIC segment having the FIC_segment_num field value of ‘0’ to the FIC segment having the FIC_segment_num field value of ‘4’ are collected. Thereafter, when the FIC segment header of each FIC segment is removed, one FIC chunk is recovered. More specifically, one FIC chunk is recovered (or configured), when the payloads of all 5 FIC segments are collected. At this point, a null FIC segment is identified by the FIC_type field within the corresponding null FIC segment header. However, the null FIC segment is discarded without being used in the FIC chunk recovery process.

Figure 18:
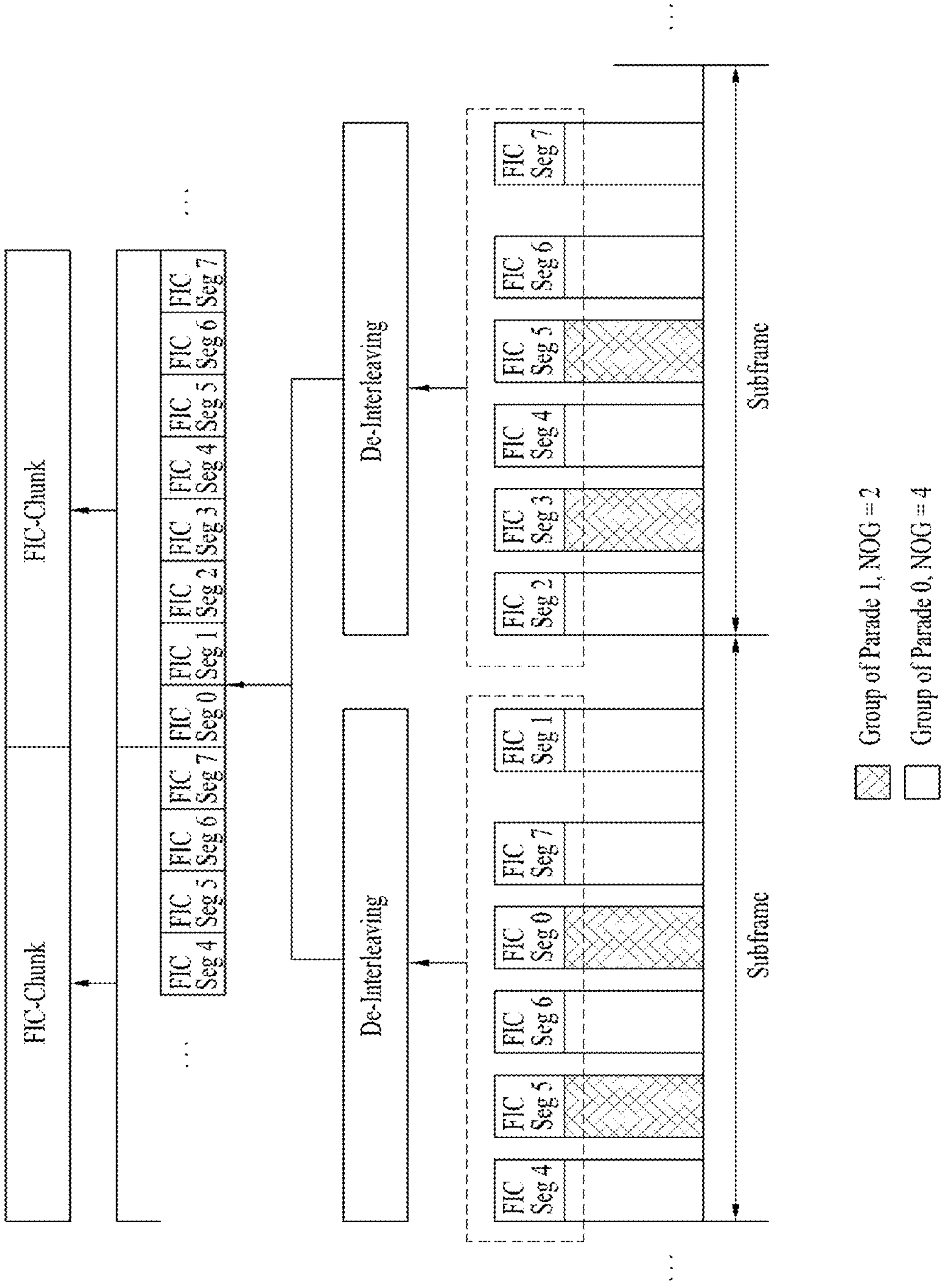
FIG. 18 illustrates another example of recovering (or obtaining) one or more FIC chunks by receiving FIC segments according to the present invention.

FIG. 18 illustrates an example of the receiving system receiving FIC segments so as to recover an FIC chunk, when the FIC chunk is transmitted through 8 FIC segments, and when the TNoG of the corresponding mobile broadcast is equal to ‘6’.

Also, in FIG. 18, although the FIC segments of one FIC chunk are transmitted through 2 sub-frames, it is apparent that the deinterleaving process is performed in sub-frame units. Since the FIC chunk recovery process of FIG. 18 is the same as the FIC chunk recovery process of FIG. 17, reference can be made to FIG. 17, and a detailed description of the same will be omitted for simplicity.

More specifically, 8 FIC segments starting from the FIC segment having the FIC_segment_num field value of ‘0’ to the FIC segment having the FIC_segment_num field value of ‘7’ are collected. Thereafter, when the FIC segment header of each FIC segment is removed, one FIC chunk is recovered. More specifically, one FIC chunk is recovered (or configured), when the payloads of all 8 FIC segments are collected. At this point, a null FIC segment is identified by the FIC_type field within the corresponding null FIC segment header. However, the null FIC segment is discarded without being used in the FIC chunk recovery process.

Meanwhile, it is assumed that multiple FIC chunks, each having a different protocol version, are transmitted through one M/H frame, and that the receiving system is capable of processing all of the FIC chunks, each having a different protocol version. At this point, when the FIC segments divided from the multiple FIC chunks, each having a different protocol version, are received normally without any error, the receiving system may perform normal recovery on the multiple FIC chunks each having a different protocol version. However, if an error caused by burst noise occurs in the multiple FIC chunks each having a different protocol version, the receiving system may not be able to perform normal recovery on the multiple FIC chunks each having a different protocol version.

Figure 19:
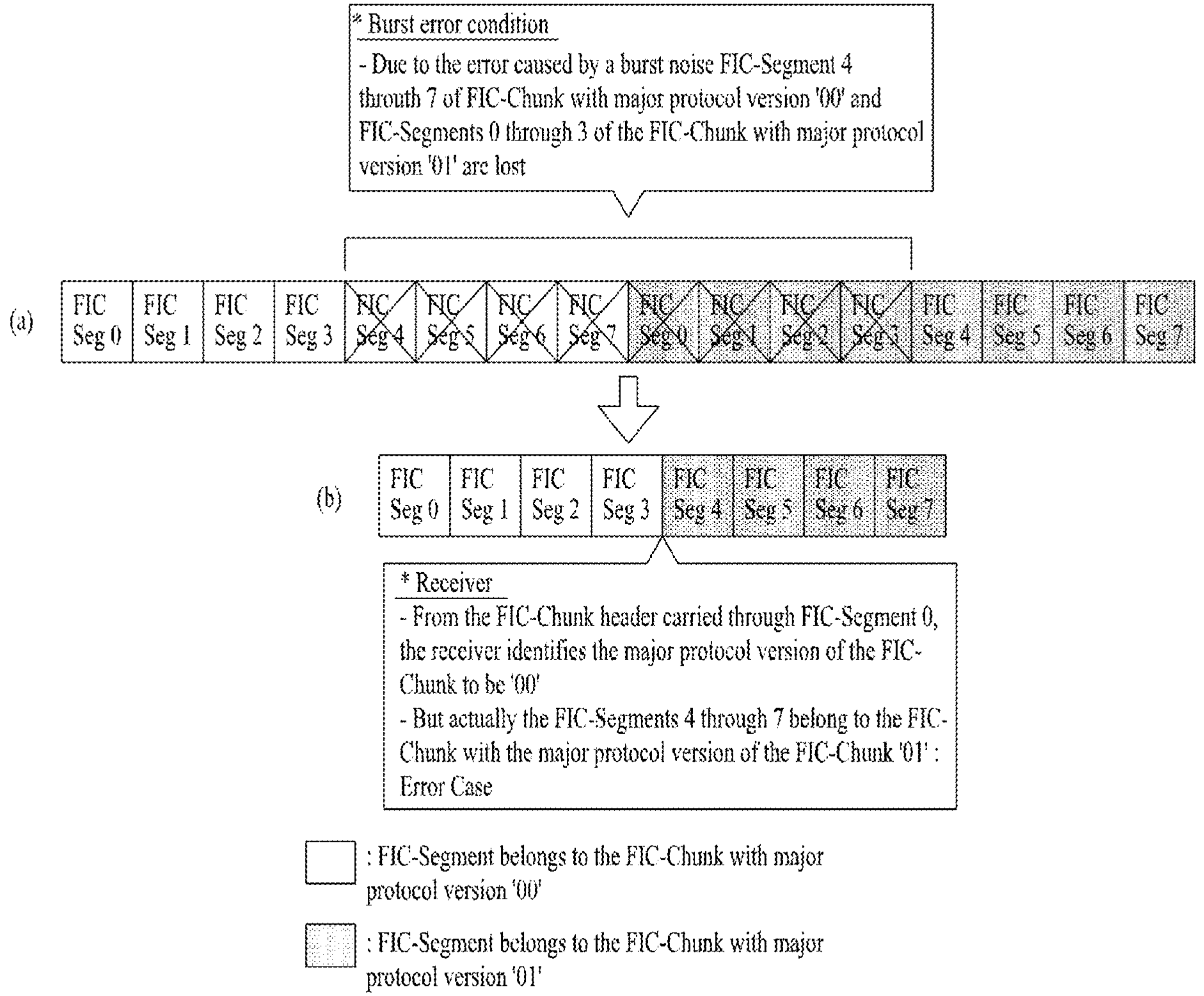
FIG. 19 illustrates an example of errors that may occur when one or more FIC chunks by receiving FIC segments is recovered according to the present invention.

For example, it is assumed that an FIC chunk having a major protocol version of ‘00’ and an FIC chunk having a major protocol version of ‘01’ are simultaneously transmitted to one FIC (i.e., one M/H frame). And, it is also assumed that, as shown in FIG. 19(*a*), FIC segment 4 to FIC segment 7, which transmit the FIC chunk having the major protocol version of '00', and that FIC segment 0 to FIC segment 3, which transmit the FIC chunk having the major protocol version of '01', are not received by the receiving system due to an error caused by burst noise.

In this case also, the receiving system uses the FIC_segment_num field and the FIC_last_segment_num field within the FIC segment header, so as to collect 8 FIC segments starting from the FIC segment having the FIC_segment_num field value of '0' to the FIC segment having the FIC_segment_num field value of '7'. Thereafter, the FIC segment header of each of the 8 FIC segments is removed, thereby configuring one FIC chunk, as shown in FIG. 19(*b*). In this case, since the FIC segment having the FIC_segment_num field value of '0' corresponds to an FIC segment divided from the FIC chunk having the major protocol version of '00', the receiving system recognizes the major protocol version of the FIC chunk, which is configured as shown in FIG. 19(*b*), as '00'.

However, in case of the FIC chunk shown in 19(*b*), FIC segment 0 to FIC segment 3 correspond to FIC segment transmitting data of the FIC chunk having the major protocol version of '00', and FIC segment 4 to FIC segment 7 correspond to FIC segment transmitting data of the FIC chunk having the major protocol version of '01'. Therefore, when a loss occurs in the FIC segments due to burst noise, the receiving system may recognize a set of FIC segments transmitting an FIC chunk having 2 different protocol versions as a set of FIC segments transmitting an FIC chunk having a single protocol version, thereby causing a problem of recovering the FIC chunk. Furthermore, when an error has occurred in the FIC chunk recovery process, as described above, the receiving system may not be able to recognize that the FIC chunk recovery has not been performed correctly. Accordingly, the receiving system may acquire an RS frame corresponding to an ensemble of a requested mobile service, thereby causing a very critical problem.

In order to resolve the above-described problem, the present invention transmits protocol version information of the FIC chunk through the FIC segment header of each FIC segment. According to the embodiment of the present invention, the protocol version information of the FIC chunk being transmitted through the FIC segment header corresponds to at least one of a major protocol version information and a minor protocol version information of the corresponding FIC chunk.

FIG. 20 illustrates a syntax structure of an FIC segment header according to another embodiment of the present invention. Herein, an FIC_Chunk_major_protocol_version field is further added to the syntax structure of the FIC segment header shown in FIG. 16.

More specifically, the FIC segment header of FIG. 20 may includes an FIC_type field, an FIC_Chunk_major_protocol_version field, an error_indicator field, an FIC_segment_num field, and an FIC_last_segment_num field. With the exception of the FIC_Chunk_major_protocol_version field, the remaining fields are identical to those described in FIG. 16. Therefore, detailed description of the same will be omitted in FIG. 20 for simplicity.

According to an embodiment of the present invention, the FIC_Chunk_major_protocol_version field corresponds to a 2-bit field, which indicates the major protocol version of the corresponding FIC chunk. More specifically, the FIC_Chunk_major_protocol_version field with in the FIC segment header has the same value as that of the FIC_major_protocol_version field within the corresponding FIC chunk header. Reference may be made to the description of the FIC chunk header in FIG. 9 for the major protocol version of the FIC chunk syntax. Therefore, detailed description of the same will be omitted herein for simplicity.

Figure 21:
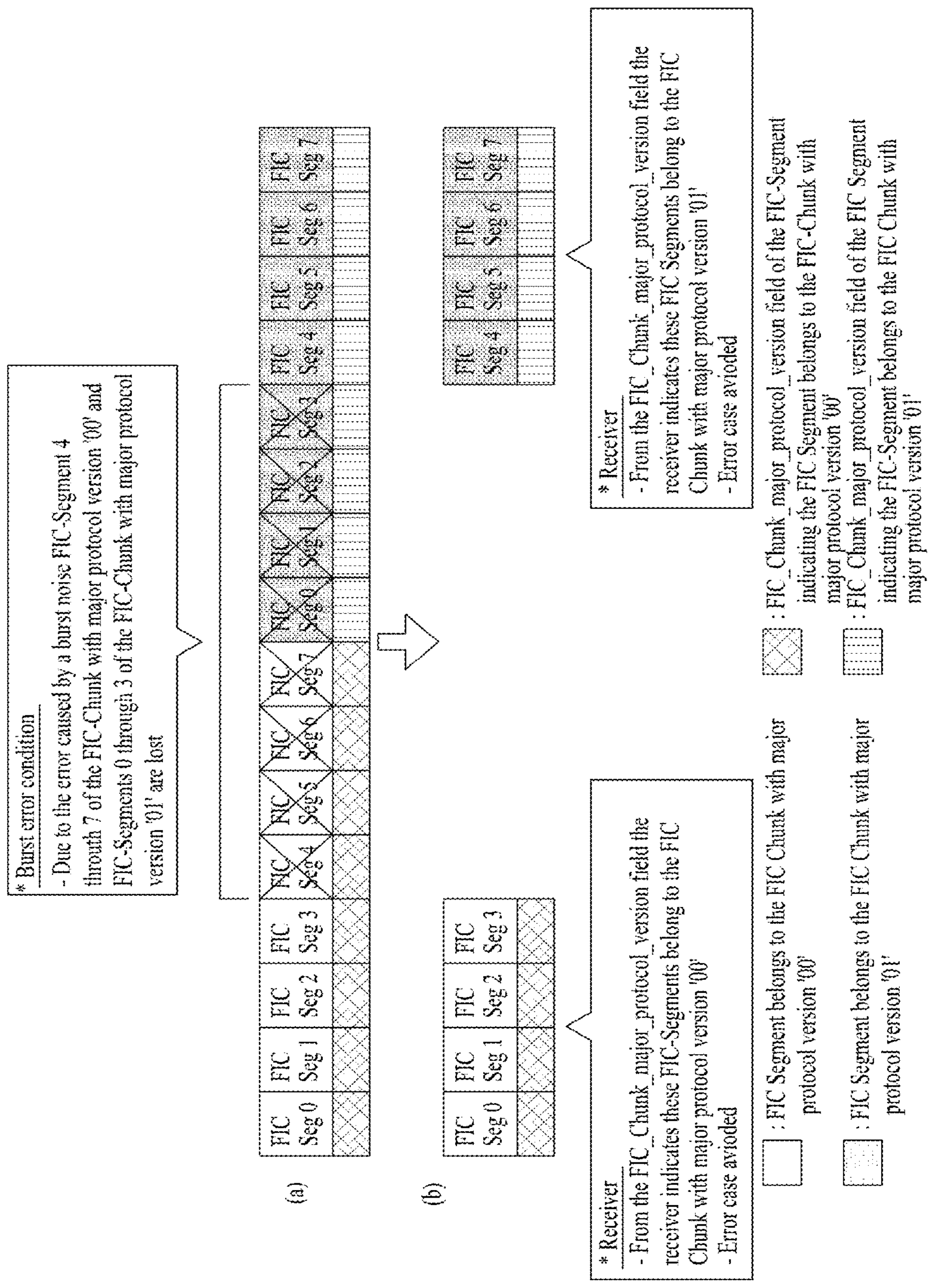
FIG. 21 illustrates another example of recovering one or more FIC chunks by receiving FIC segments according to the present invention.

FIG. 21 illustrates an example of receiving FIC segments having an FIC segment header as shown in FIG. 20 and recovering the FIC chunk. In this case also, it is assumed multiple FIC chunks (e.g., 2 FIC chunks) are transmitted to one FIC (i.e., one M/H frame), that each major protocol version of the two FIC chunks is different from one another, and that the receiving system can process both FIC chunks, each having a different major protocol version.

More specifically, it is assumed that an FIC chunk having a major protocol version of '00' and an FIC chunk having a major protocol version of '01' are simultaneously transmitted to one FIC (i.e., one M/H frame), as shown in FIG. 21(*a*), and that, due to an error caused by burst noise, the receiving system has failed to receive FIC segment 4 to FIC segment 7, which transmit the FIC chunk having the major protocol version of '00', and FIC segment 0 to FIC segment 3, which transmit the FIC chunk having the major protocol version of '01'.

At this point, the receiving system uses the FIC_segment_num field, the FIC_last_segment_num field, and the FIC_Chunk_major_protocol_version within the FIC segment header, so as to recover the FIC chunk.

More specifically, since the FIC_Chunk_major_protocol_version field values starting from FIC segment 0 to FIC segment 3 are different from the FIC_Chunk_major_protocol_version field values starting from FIC segment 4 to FIC segment 7, respectively, even though the FIC segment numbers are consecutive, if the FIC chunk protocol versions are different from one another, the data cannot be configured as a single FIC chunk.

The FIC handler 121 of the receiving system according to the present invention collects 4 FIC segments starting from the FIC segment having the FIC_segment_num field value of '0' to the FIC segment having the FIC_segment_num field value of '3', as shown in FIG. 21(*b*). Thereafter, the FIC segment header of each of the 4 FIC segments is removed, thereby configuring a FIC chunk having the major protocol version of '00'. Additionally, the FIC handler 121 collects 4 FIC segments starting from the FIC segment having the FIC_segment_num field value of '4' to the FIC segment having the FIC_segment_num field value of '7'. Afterwards, the FIC segment header of each of the 4 FIC segments is removed, thereby configuring a FIC chunk having the major protocol version of '01'.

Therefore, when a loss occurs in the FIC segments due to burst noise, the problem of the receiving system recognizing a set of FIC segments transmitting an FIC chunk having 2 different protocol versions as a set of FIC segments transmitting an FIC chunk having a single protocol version may be prevented.

More specifically, by allocating protocol version information of the corresponding FIC chunk even in the FIC segment header, even if a mixture of multiple FIC segments corresponding to an FIC chunk having different protocol versions within a single M/H frame are being received, the present invention may collect only the FIC segments corresponding to the same protocol version, thereby recovering the FIC chunk.

At this point, when the FIC chunk is recovered, as shown in FIG. 21, the FIC chink is not fully recovered. For example, an FIC chunk having a major protocol version of '00' is missing 4 FIC segments starting from the FIC segment having the FIC_segment_num field value of '4' to the FIC segment having the FIC_segment_num field value of '7'. Furthermore, an FIC chunk having a major protocol version of '01' is missing 4 FIC segments starting from the FIC segment having the FIC_segment_num field value of '1' to the FIC segment having the FIC_segment_num field value of '3'.

Therefore, according to an embodiment of the present invention, the FIC chunk is not recovered in this case. More specifically, when all FIC segments having the same major protocol version are gathered, and when the number of gathered FIC segments is smaller than the number of FIC segments divided from the corresponding FIC chunk, then the corresponding FIC chunk is not recovered.

At this point, the process of gathering FIC segments in order to recover one FIC chunk may be performed in a single sub-frame unit or in a single M/H frame unit. This is because the same FIC chunk may be repeated and then transmitted within a single sub-frame, and also because the same FIC chunk may be repeated and then transmitted within a single M/H frame. Moreover, the process of gathering FIC segments may also be performed in a pre-determined (or pre-designated) number of sub-frame units or in a pre-determined (or pre-designated) number of M/H frame units.

Furthermore, according to an embodiment of the present invention, it is assumed that an FIC chunk having another major protocol version co-exists within a single M/H frame, and that the receiving system is capable of processing both FIC chunks, each having a different major protocol version. In this case, a current FIC segment number, a last FIC segment number, and a major protocol version of each FIC segment are checked, so that FIC segments having the same major protocol version as that of the receiving system can be gathered, thereby configuring the FIC chunk.

Alternatively, when it is assumed that an FIC chunk having another major protocol version co-exists within a single M/H frame, and that the receiving system is capable of processing only one of the two major protocol versions, the FIC chunk is recovered from the FIC segments having their processable major protocol version signaled.

Meanwhile, as described above, the present invention uses the FIC chunk, so as to transmit the mapping (or configuration) information between an ensemble and a mobile service within an M/H frame. Herein, when reconfiguration occurs, wherein the mapping information between the ensemble and the mobile service within a current M/H frame differs from the mapping information between the ensemble and the mobile service within a next M/H frame, the present invention may use at least one FIC chunk from the M/H frame prior to the corresponding reconfiguration, in order to signal in advance (or perform advanced signaling of) the mapping information between the ensemble and the mobile service within the M/H frame, wherein the reconfiguration occurs. In the description of the present invention, the M/H frame prior to the occurrence of the reconfiguration will be referred to as the current M/H frame, and the M/H frame after the occurrence of the reconfiguration will be referred to as the next M/H frame.

Furthermore, according to the embodiment of the present invention, the FIC chunk signaling the mapping information between an ensemble and a mobile service within the current M/H frame and the FIC chunk signaling the mapping information between an ensemble and a mobile service within the next M/H frame are alternately transmitted from a single M/H frame. Herein, according to the embodiment of the present invention, the FIC chunk signaling the mapping information between an ensemble and a mobile service within the next M/H frame is chronologically placed behind and transmitted after the FIC chunk signaling the mapping information between an ensemble and a mobile service within the current M/H frame. More specifically, the receiving system first receives the FIC chunk signaling the mapping information between an ensemble and a mobile service within the current M/H frame and, then, receives the FIC chunk signaling the mapping information between an ensemble and a mobile service within the next M/H frame later on.

At this point, when the FIC chunk is received and recovered, the FIC handler 121 of the receiving system uses the current_next_indicator field within the recovered FIC chunk header, so as to determine whether the signaling information included in the payload of the respective FIC chunk corresponds to the mapping information between an ensemble and a mobile service within the current M/H frame or to the mapping information between an ensemble and a mobile service within the next M/H frame. Hereinafter, the mapping information between an ensemble and a mobile service within an M/H frame will also be referred to as ensemble configuration information of an M/H frame for simplicity.

FIG. 22 illustrates an exemplary occurrence of reconfiguration, wherein the ensemble configuration information of the current M/H frame differs from the ensemble configuration information of the next M/H frame. Referring to FIG. 22, the portions indicated as '. . . , k−1, k, k+1, k+2, k+3, . . . ' represents a respective M/H frame. And, in this example, the reconfiguration has occurred in the $(k+2)^{th}$ M/H frame. As shown in FIG. 22, an M/H frame prior to the occurrence of reconfiguration consists of two ensembles and seven TNoGs. And, an M/H frame after the occurrence of reconfiguration consists of three ensembles and seven TNoG.

As shown in FIG. 22, when reconfiguration occurs due to a change in the number of ensembles being transmitted to the respective M/H frame, the number of mobile service being transmitted to each ensemble, and the number of TNoG of each sub-frame, the major protocol version information and the minor protocol version information of the FIC chunk remain unchanged. However, the FIC_version field value within the TPC data is changed.

FIG. 22 shows an example of the FIC_version field value within the TPC data being updated to '6' after being increased (or incremented) by '1' in the $(k+1)^{th}$ M/H frame and, also, shows an example of the current_next_indicator field value within the FIC chunk header being changed to '0' in the $(k+1)^{th}$ M/H frame.

Figure 23:
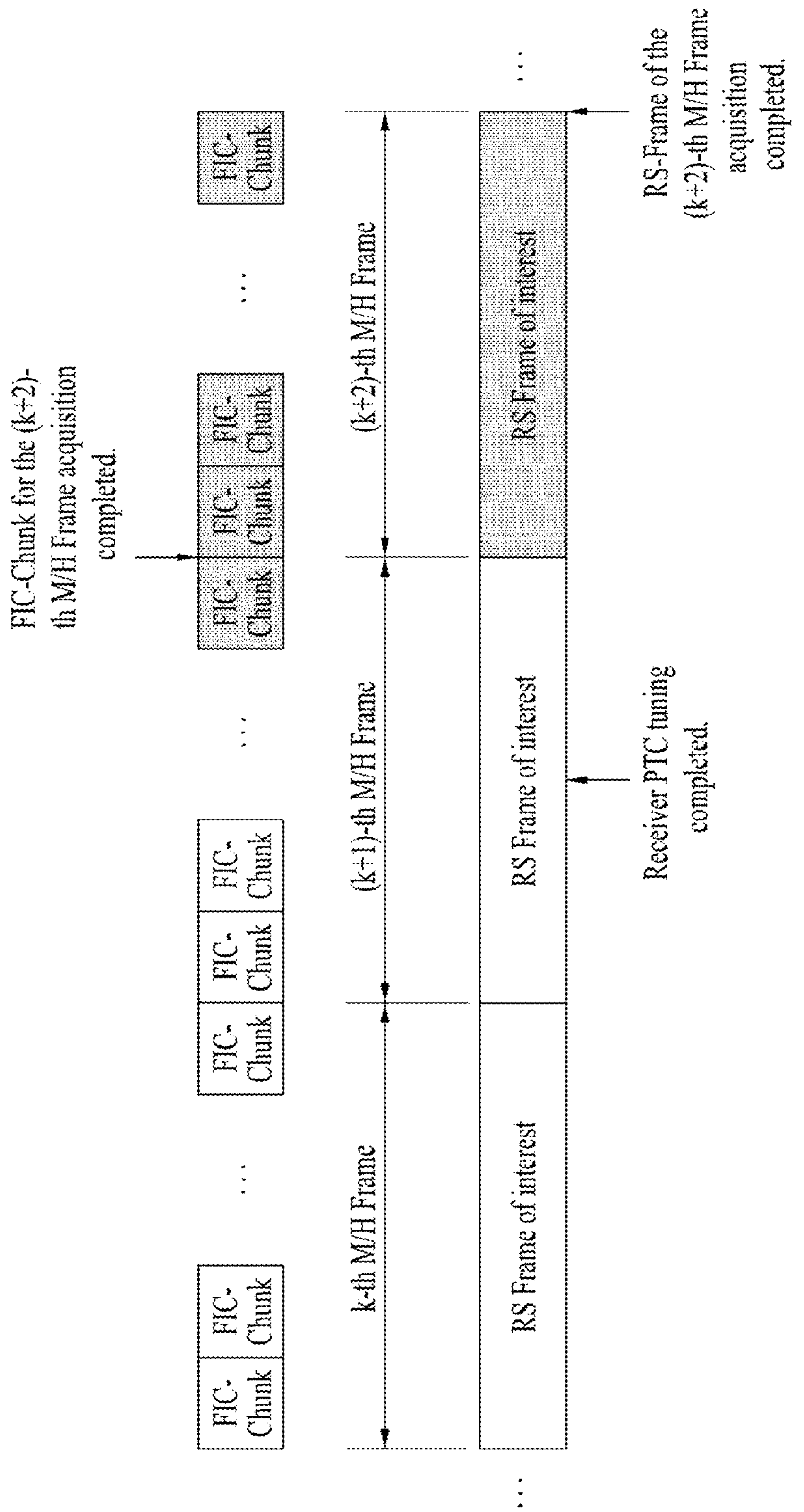
FIG. 23 illustrates an exemplary RS frame acquisition process by performing an advanced signaling on a FIC chunk according to the present invention.

FIG. 23 illustrates an exemplary RS frame acquisition process, when reconfiguration occurs in the $(k+2)^{th}$ M/H frame, and when the ensemble configuration information of the current M/H frame and the ensemble configuration information of the next M/H frame are alternately transmitted from the $(k+1)^{th}$ M/H frame.

Referring to the $(k+1)^{th}$ M/H frame of FIG. 23, the FIC chunk signaling the ensemble configuration information of the current M/H frame is received earlier than the FIC chunk signaling the ensemble configuration information of the next M/H frame, thereby being recovered.

At this point, when tuning of a physical channel including the requested ensemble is performed at a mid-portion of the $(k+1)^{th}$ M/H frame, as shown in FIG. 23, the ensemble configuration information of the $(k+2)^{th}$ M/H frame may be acquired from the $(k+1)^{th}$ M/H frame. More specifically, when reconfiguration occurs, wherein mapping information between an ensemble and a mobile service within a mobile broadcast is changed, by performing an advanced signaling of the ensemble configuration information of a reconfiguration-occurred M/H frame to an FIC chunk being transmitted to an M/H frame prior to the corresponding reconfiguration, the present invention may be able to quickly acquire the ensemble configuration information of the M/H frame having the corresponding reconfiguration occurred therein (i.e., the corresponding reconfiguration-occurred M/H frame). Also, by using the ensemble configuration information of the $(k+2)^{th}$ M/H frame, which is acquired from the $(k+1)^{th}$ M/H frame, the present invention may acquire the RS frame being transmitted to the $(k+2)^{th}$ M/H frame, thereby being able to completely recover the acquired RS frame.

Figure 24:
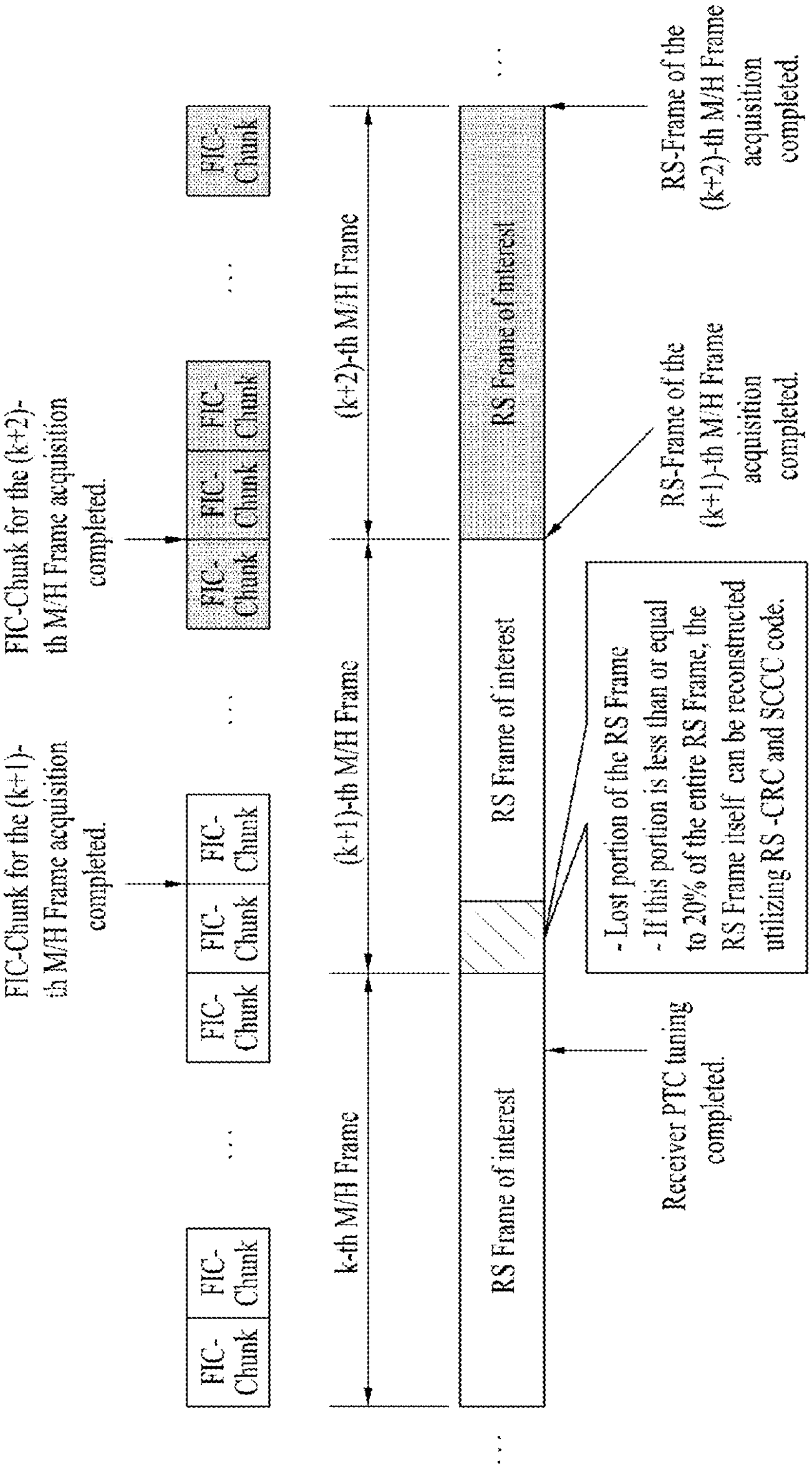
FIG. 24 illustrates another exemplary RS frame acquisition process by performing an advanced signaling on a FIC chunk according to the present invention.

Referring to FIG. 24, with the exception of the tuning of the physical channel including the requested ensemble being performed at an end-portion of the $k^{th}$ M/H frame, the rest of the tuning process is the identical to the process steps shown in FIG. 23. At this point, when the receiving system fails to receive an RS frame portion corresponding to approximately 20% of the M/H frame, the entire RS frame may be recovered by using RS-CRC decoding and SCCC decoding processes. For example, it is assumed that the tuning of a physical channel including the requested ensemble is performed at an end-portion of the $k^{th}$ M/H frame, and that signaling information of the $(k+1)^{th}$ M/H frame is entirely (or completely) acquired from the $1^{st}$ FIC chunk of the $(k+1)^{th}$ M/H frame.

In this case, while receiving the $1^{st}$ FIC chunk of the $(k+1)^{th}$ M/H frame, the RS frame being transmitted to the $(k+1)^{th}$ M/H frame cannot be received. However, when the non-received portion corresponds to approximately 20% of the $(k+1)^{th}$ M/H frame, the entire RS frame being transmitted to the $(k+1)^{th}$ M/H frame may be recovered by using RS-CRC decoding and SCCC decoding processes. Furthermore, even if reconfiguration occurs in the $(k+1)^{th}$ M/H frame, the present invention may use the signaling information of the $(k+2)^{th}$ M/H frame, which is acquired from the $(k+1)^{th}$ M/H frame, in order to completely recover the RS frame being transmitted to the $(k+2)^{th}$ M/H frame.

As described above, based upon a tuning point of the physical channel and a FIC chunk data structure in an M/H frame prior to the occurrence of the reconfiguration, the present invention may quickly acquire and recover an RS frame, thereby being able to service the required RS frame to the user.

However, as described above, when an FIC chunk signaling the mapping information between an ensemble and a mobile service within a current M/H frame and an FIC chunk signaling the mapping information between an ensemble and a mobile service within the next M/H frame co-exist in a single M/H frame, the same problem that occurs when FIC chunks having different protocol versions are received in a single M/H frame may also occur in this case. More specifically, there may occur an error, wherein one FIC chunk is recovered from an FIC segment transmitting FIC chunk signaling the mapping information between an ensemble and a mobile service within a current M/H frame and an FIC segment transmitting FIC chunk signaling the mapping information between an ensemble and a mobile service within a next M/H frame. As described above, when an error occurs during the recovery of an FIC chunk, ensemble configuration information of a next M/H frame cannot be appropriately acquired from the recovered FIC chunk. Accordingly, the RS frame being transmitted to the next M/H frame may also fail to be appropriately acquired and recovered.

For example, when the FIC segments of the FIC chunk signaling the mapping information between an ensemble and a mobile service within a current M/H frame and the FIC segments of the FIC chunk signaling the mapping information between an ensemble and a mobile service within a next M/H frame are received in a mixed order, the receiving system is incapable of determining whether the corresponding FIC segment that is being received corresponds to an FIC segment belonging to the FIC chunk signaling the mapping information between an ensemble and a mobile service within a current M/H frame or to an FIC segment belonging to the FIC chunk signaling the mapping information between an ensemble and a mobile service within a next M/H frame. Therefore, the above-described problem may occur.

Furthermore, when FIC segments have been lost due to an error caused by burst noise, the receiving system may also be incapable of determining whether the corresponding FIC segment that is being received corresponds to an FIC segment belonging to the FIC chunk signaling the mapping information between an ensemble and a mobile service within a current M/H frame or to an FIC segment belonging to the FIC chunk signaling the mapping information between an ensemble and a mobile service within a next M/H frame. Therefore, in this case also, the above-described problem may occur.

Figure 25:
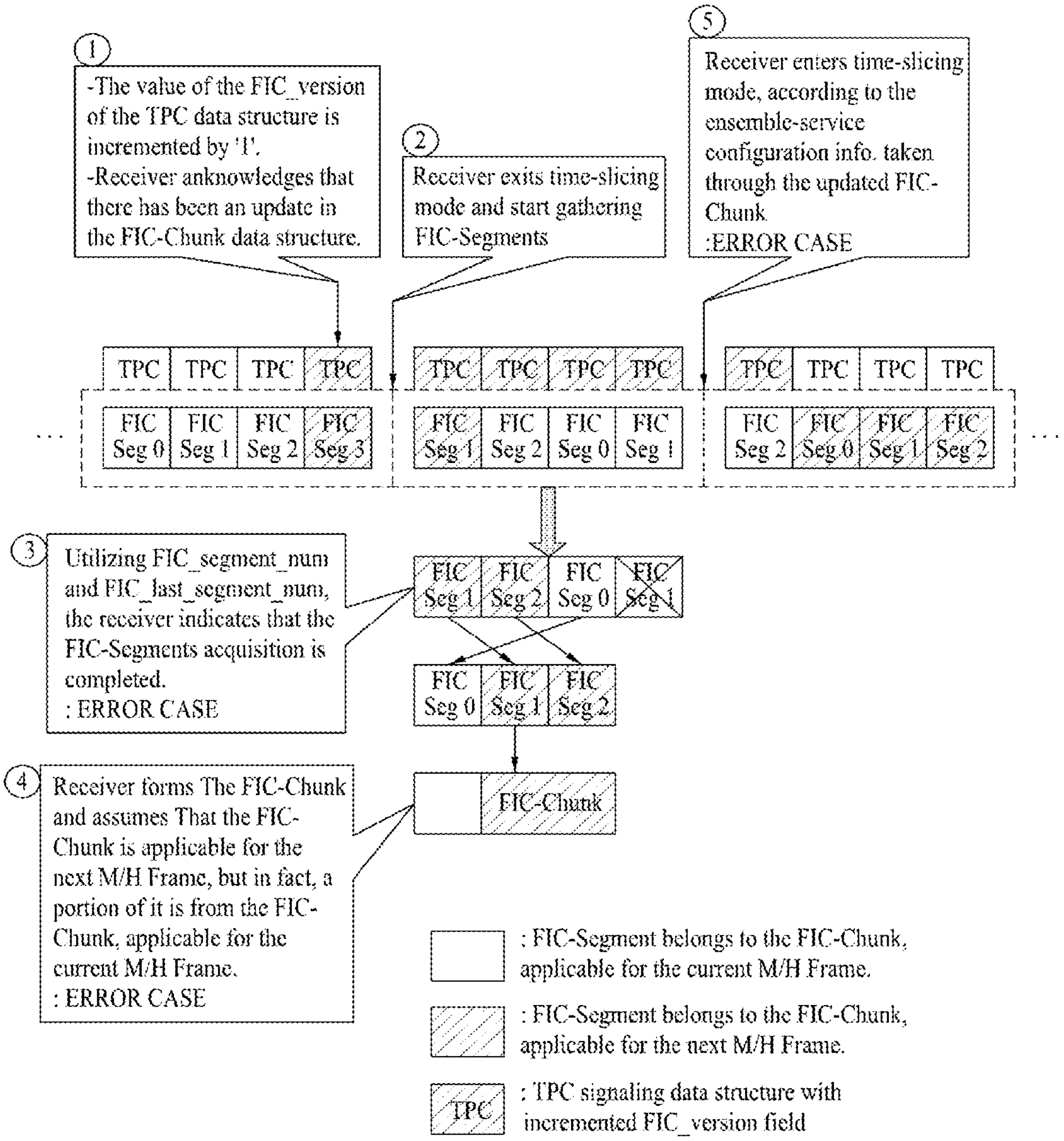
FIG. 25 illustrates another example of errors that may occur when one or more FIC chunks by receiving FIC segments is recovered according to the present invention.

Similarly, the above-described problem may also occur when the TPC data and the FIC segment are being received, as shown in FIG. 25. More specifically, as shown in of FIG. 25, the FIC_version field value within the TPC data is increased by '1', in the $1^{st}$ FIC segment of the FIC chunk signaling the mapping information between an ensemble and a mobile service within a next M/H frame. Accordingly, the receiving system may exit from the time-slicing mode, as shown in of FIG. 25, thereby gathering (or collecting) the FIC segments.

Furthermore, as shown in of FIG. 25, the receiving system uses the FIC_segment_num field and the FIC_last_segment_num field within each FIC segment header of the gathered FIC segments, so as to gather only the FIC segments configuring a single FIC chunk, thereby aligning each of the FIC segments in the order of the respective FIC segment numbers. Thereafter, the receiving system removes the header of from each of the aligned FIC segments. Accordingly, a single FIC chunk is configured, as shown in of FIG. 25. Then, the receiving system acquires ensemble configuration information of the M/H frame from the configured FIC chunk. Subsequently, the receiving system enters the time-slicing mode, as shown in of FIG. 25, in accordance with the acquired ensemble configuration information.

However, when referring to the FIC segments gathered as shown in of FIG. 25, it is apparent that FIC segments of an FIC chunk signaling the ensemble configuration information within a current M/H frame and FIC segments of an FIC chunk signaling the ensemble configuration information within the next M/H frame are mixed (or co-exist). More specifically, of FIG. 25 shows an example of an incorrect gathering of the FIC segments. This is because the receiving system is incapable of determining whether a corresponding FIC segment is an FIC segment belonging to the FIC chunk signaling the ensemble configuration information within a current M/H frame or an FIC segment belonging to the FIC chunk signaling the ensemble configuration information within a next M/H frame.

Furthermore, when an FIC chunk is configured as shown in of FIG. 25, the receiving system determines that the corresponding FIC chunk is signaling ensemble configuration information of a next M/H frame. However, the FIC chunk includes a portion of the data included in the FIC chunk signaling the ensemble configuration information within a current M/H frame. More specifically, of FIG. 25 shows an example of the FIC chunk being recovered while including wrong (or incorrect) information. Accordingly, since the ensemble configuration information that is acquired from an incorrectly recovered FIC chunk corresponds incorrect information, the RS frame being transmitted to the next M/H frame may not be correctly acquired and recovered.

According to the embodiment of the present invention, in order to resolve such problems, in transmitting M/H frame identification information through the FIC segment header of each FIC segment, the M/H frame identification information notifies whether the corresponding FIC segment is an FIC segment of the FIC chunk signaling the ensemble configuration information of the current M/H frame or an FIC segment of the FIC chunk signaling the ensemble configuration information of the next M/H frame. According to the embodiment of the present invention, the M/H frame identification information being transmitted through the FIC segment header corresponds to the current_next_indicator field.

FIG. 26 illustrates a syntax structure of an FIC segment header according to another embodiment of the present invention. More specifically, a current_next_indicator field is additionally included in the syntax structure of the FIC segment header shown in FIG. 20. According to the present invention, the current_next_indicator field is assigned with 1 bit.

More specifically, the FIC segment header of FIG. 26 may include an FIC_type field, an FIC_Chunk_major_protocol_version field, a current_next_indicator field, an error_indicator field, an FIC_segment_num field, and an FIC_last_segment_num field. Since reference may be made to FIG. 16 for the description of the FIC_type field, the error_indicator field, the FIC_segment_num field, and the FIC_last_segment_num field, detailed description of the same will be omitted for simplicity.

The FIC_Chunk_major_protocol_version field corresponds to a 2-bit field, which indicates a major protocol version of the corresponding FIC chunk. At this point, the value of the FIC_Chunk_major_protocol_version field should be the same as the value of the FIC_major_protocol_version field within the corresponding FIC chunk header. Since reference may be made to the description of the FIC chunk header shown in FIG. 9, a detailed description of the major protocol version of the FIC chunk syntax will be omitted for simplicity.

The current_next_indicator field corresponds to a 1-bit indicator, which, when set to '1', shall indicate that the corresponding FIC segment is carrying a portion of the FIC chunk, which is applicable to the current M/H frame. Alternatively, when the value of the current_next_indicator field is set to '0', the current_next_indicator field shall indicate that the corresponding FIC segment is carrying a portion of the FIC chunk, which will be applicable for the next M/H frame. In the former case, the most recent version of the FIC chunk transmitted with the current_next_indicator field value set to '1' shall be currently applicable.

Furthermore, in the signaling information region within the data group, the TPC data being allocated along with the FIC data and then transmitted include parameters that are mostly used in a physical layer module. And, since the TPC data are transmitted without being interleaved, the receiving system is capable of accessing the TPC data by slot units. According to the embodiment of the present invention, by using the property enabling the TPC data, which include the FIC_version field, to be received by slot units, when the FIC chunk is updated, the receiving system may use the FIC_version field of the TPC data in order to determine the update status of the corresponding FIC chunk. Also, when the update status of the corresponding FIC chunk is detected, the receiving system exits from the time-slicing mode, so as to enable the FIC segments to be integrated (or combined).

FIG. 27 illustrates an example of a syntax structure of TPC data.

The TPC data may include a sub-frame_number field, a slot_number field, a parade_id field, a starting_group_number (SGN) field, a number_of_groups (NoG) field, a parade_repetition_cycle (PRC) field, an RS_frame_mode field, an RS_code_mode_primary field, an RS_code_mode_secondary field, an SCCC_block_mode field, an SCCC_outer_code_mode_A field, an SCCC_outer_code_mode_B field, an SCCC_outer_code_mode_C field, an SCCC_outer_code_mode_D field, an FIC_version field, a parade_continuity_counter field, a TNoG field, and a TPC_protocol_version field.

The Sub-Frame_number field indicates the number of a current sub-frame within a corresponding M/H frame and is transmitted for M/H frame synchronization. A value of the Sub-frame_number field shall range from 0 to 4.

The Slot_number field is the current Slot number within the Sub-Frame, which is transmitted for M/H Frame synchronization. Its value shall range from 0 to 15.

The Parade_id field identifies the Parade to which this Group belongs. The value of this field may be any 7-bit value. Each Parade in an M/H transmission shall have a unique Parade_id. In this case, communication of the Parade_id between the physical layer and the management layer shall be performed by means of an ensemble_id formed by adding one bit to the left of the Parade_id. If the Ensemble_id is for the primary ensemble delivered through this Parade, the added MSB shall be '0'. Otherwise, if it is for the secondary ensemble, the added MSB shall be '1'.

The starting_Group_number (SGN) field shall be the first Slot_number for a Parade to which this Group belongs (after the Slot numbers for all preceding Parades have been calculated).

The number_of_Groups (NoG) field shall be the number of Groups in a Sub-Frame assigned to the Parade to which this Group belongs, minus 1, e.g., NoG=0 implies that one Group is allocated to this Parade in a Sub-Frame. A value of the NoG field shall range from 0 to 7. Slot numbers assigned to the corresponding parade can be calculated from SGN and NoG.

The Parade_repetition_cycle (PRC) field shall be the cycle time over which the Parade is transmitted, minus 1, specified in units of M/H Frames.

The RS_Frame_mode field indicates whether a single parade carries a single RS frame or two RS frames.

The RS_code_mode_primary field indicates an RS code mode for a primary RS frame.

The RS_code_mode_secondary field indicates an RS code mode for a secondary RS frame.

The SCCC_Block_mode field indicates how M/H blocks within a data group are allocated to SCCC block.

The SCCC_outer_code_mode_A field indicates an SCCC outer mode code for a region A within a data group.

The SCCC_outer_code_mode_B field indicates an SCCC outer mode code for a region B within a data group.

The SCCC_outer_code_mode_C field indicates an SCCC outer mode code for a region C within a data group.

The SCCC_outer_code_mode_D field indicates an SCCC outer mode code for a region D within a data group.

The FIC_version field indicates a version of FIC data. More specifically, the FIC_version field represents the version of the FIC-Chunk data structure. The value of this field shall be set equally to all the TPC data structure delivered through one M/H frame and shall be incremented by one whenever there is a FIC-Segment with current_next_indicator field set to '0' in the Sub frame, where the TPC data structure is delivered. For example, when a number of mobile services included in ensemble 0 is changed 2 into 3, the value of the FIC_version field is changed.

The Parade_continuity_counter field is incremented to 0~15 and is incremented by 1 for each (PRC+1) M/H frame. For instance, if PRC=011, the Parade_continuity_counter field is incremented each fourth M/H frame.

The TNoG field indicates the total number of data groups to be transmitted during a Sub-Frame. In other words, it is the sum of NoGs of all Parades within a Sub-Frame. Its value shall be in the range of 0 through 16 inclusive. The TNoG field is used both for current M/H frame information and for signaling in advance.

The tpc_protocol_version field corresponds to a 5-bit unsigned integer and represents a version of the corresponding TPC syntax structure. The 2 most-significant bits are the major version level; the least-significant three bits are the minor version level, to be interpreted as follows: A change in the major version level shall indicate a non-backward-compatible level of change. A change in the minor version level, provided the major version level remains the same, shall indicate a backward-compatible level of change. The initial value for this field shall be '11111'. At least one of the bits shall be changed so as to form a previously unused value of this field each time the TPC structure is changed by a future version of this standard. Other values of the version may be used in future to signal use of the reserved bits or a change in the defined syntax. The first such change shall be to '00' or '000', so that this field increments in the same manner as other fields for later changes.

However, the information included in the TPC data presented herein is merely exemplary. And, since the adding or deleting of information included in the TPC may be easily adjusted and modified by one skilled in the art, the present invention will, therefore, not be limited to the examples set forth herein.

Since the TPC data (excluding the Sub-Frame_number field and the Slot_number field) for each parade do not change their values during an M/H frame, the same information is repeatedly transmitted through all M/H groups belonging to the corresponding parade during an M/H frame. This allows very robust and reliable reception of the TPC data. Because the Sub-Frame_number and the Slot_number are increasing counter values, they also are robust due to the transmission of regularly expected values.

Figure 28:
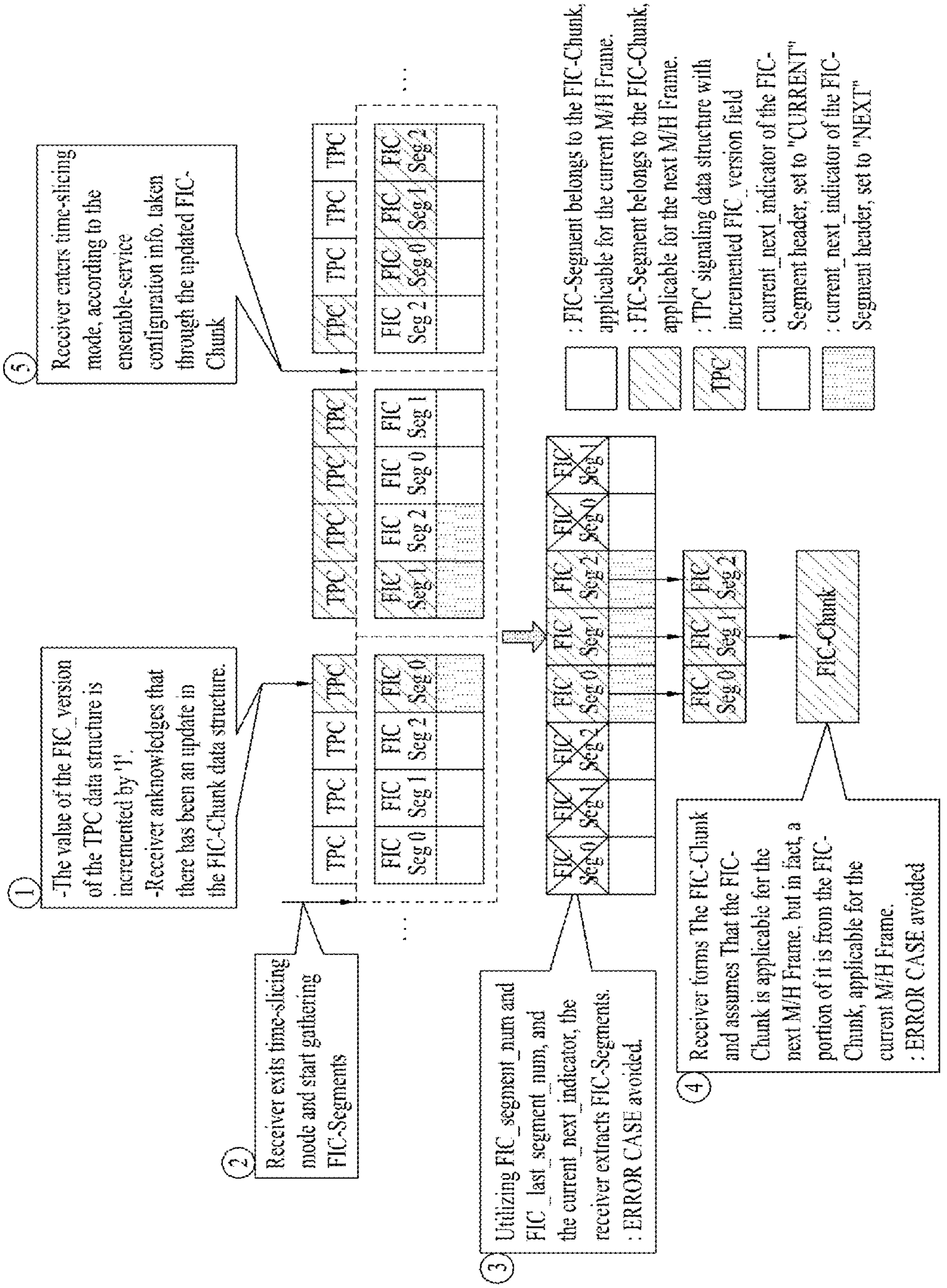
FIG. 28 illustrates another example of recovering one or more FIC chunks by receiving FIC segments according to the present invention.

FIG. 28 illustrates an example of receiving FIC segments each having an FIC segment header shown in FIG. 26 and TPC data having the structure shown in FIG. 27, thereby recovering an FIC chunk. More specifically, when the FIC_version field value of the TPC data structure is increased by '1', as shown in ① of FIG. 28, the receiving system determines that the data structure of the corresponding FIC chunk has been updated. Then, the receiving system exists from the time-slicing mode, as shown in ② of FIG. 28, so as to gather (or collect) FIC segments.

Thereafter, as shown in ③ of FIG. 28, the receiving system uses the FIC_segment_num field, the FIC_last_segment_num field, and the current_next_indicator field within each FIC segment header of the collected FIC segments, so as to gather only the FIC segments that configure one FIC chunk. Subsequently, the receiving system aligns each of the gathered FIC segments in the order of the respective FIC segment numbers. Then, the receiving system removes the header of each FIC segment, thereby configuring an FIC chunk, as shown in ④ of FIG. 28. Afterwards, the receiving system acquires ensemble configuration information of an M/H frame from the configured FIC chunk, so as to enter the time-slicing mode based upon the acquired ensemble configuration information, as shown in ⑤ of FIG. 28.

In case of ③ of FIG. 28, when gathering only the FIC segments configuring one FIC chunk, the FIC_Chunk_major_protocol_version field within the FIC segment header may be additionally used. More specifically, the receiving system may use the segment_num field, the FIC_last_segment_num field, the current_next_indicator field, and the FIC_Chunk_major_protocol_version field, so as to gather only the FIC segments of an FIC chunk signaling ensemble configuration information of a next (or current) M/H frame corresponding to the same protocol version. Subsequently, the receiving system aligns each of the gathered FIC segments in the order of the respective FIC segment numbers. Then, the receiving system removes the header of each FIC segment, thereby configuring an FIC chunk. When configuring an FIC chunk as described above, the FIC chunk may be configured only of FIC segments corresponding to an FIC chunk signaling ensemble configuration information of a next M/H frame, as shown in ④ of FIG. 28.

Therefore, the receiving system may prevent the problem of configuring a single FIC chunk by gathering FIC segments belonging to the FIC chunk signaling the ensemble configuration information within a current M/H frame and FIC segments belonging to the FIC chunk signaling the ensemble configuration information within a next M/H frame. More specifically, the present invention allocates an M/H frame identification information to each FIC segment header. Herein, the M/H frame identification information may identify whether the signaling information being transmitted to the payload of a respective FIC segment corresponds to signaling information of the current M/H frame or to the signaling information of the next M/H frame. Thus, the receiving system may be able to acquire the ensemble configuration information of the next M/H frame from the FIC chunk without any errors. Accordingly, the receiving system is capable of properly acquiring and recovering an RS frame, which is to be transmitted to the next M/H frame.

Figure 29:
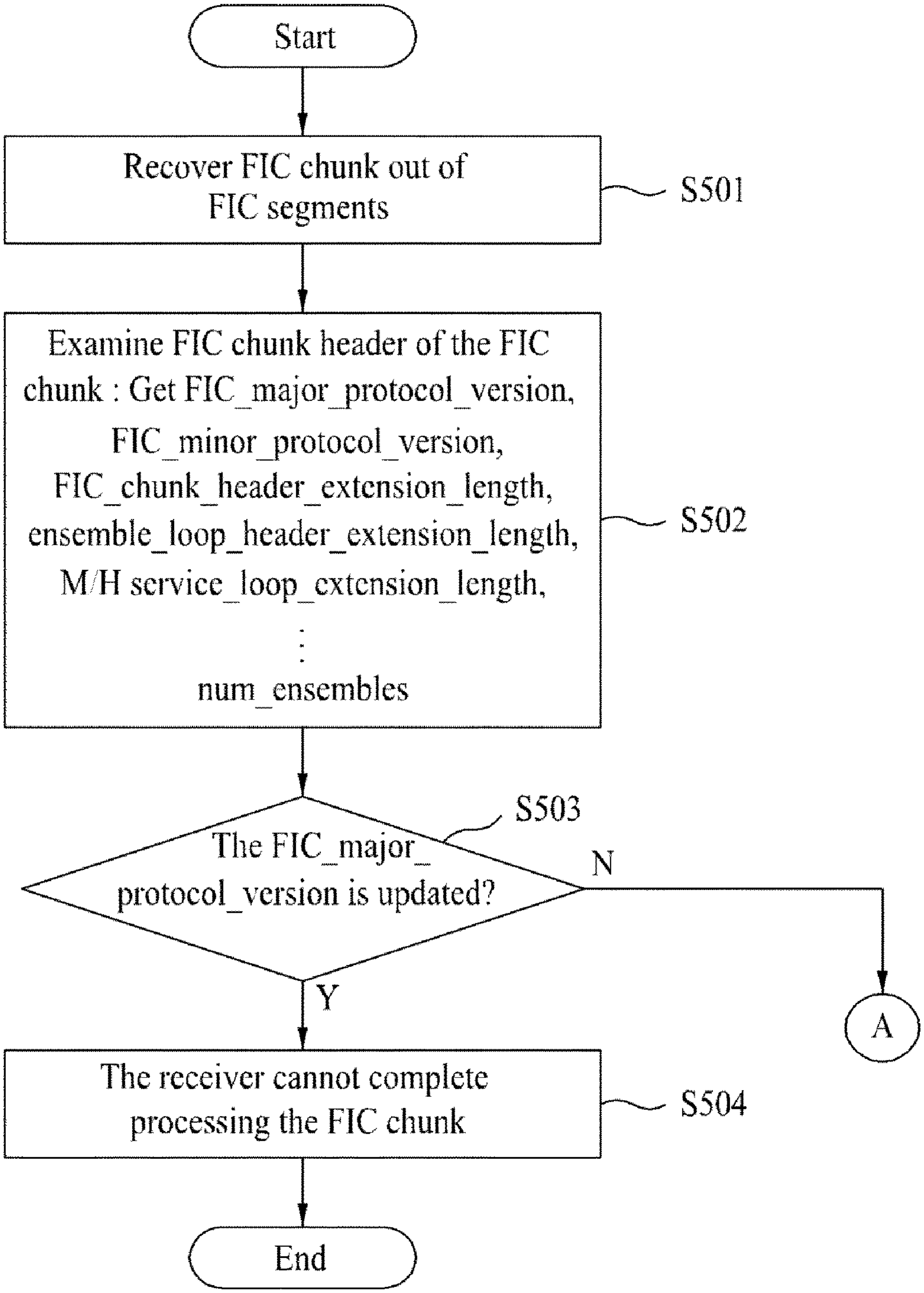
FIG. 29 and FIG. 30 illustrate flow-charts of recovering one or more FIC chunks by receiving FIC segments according to an embodiment of the present invention.
Figure 30:
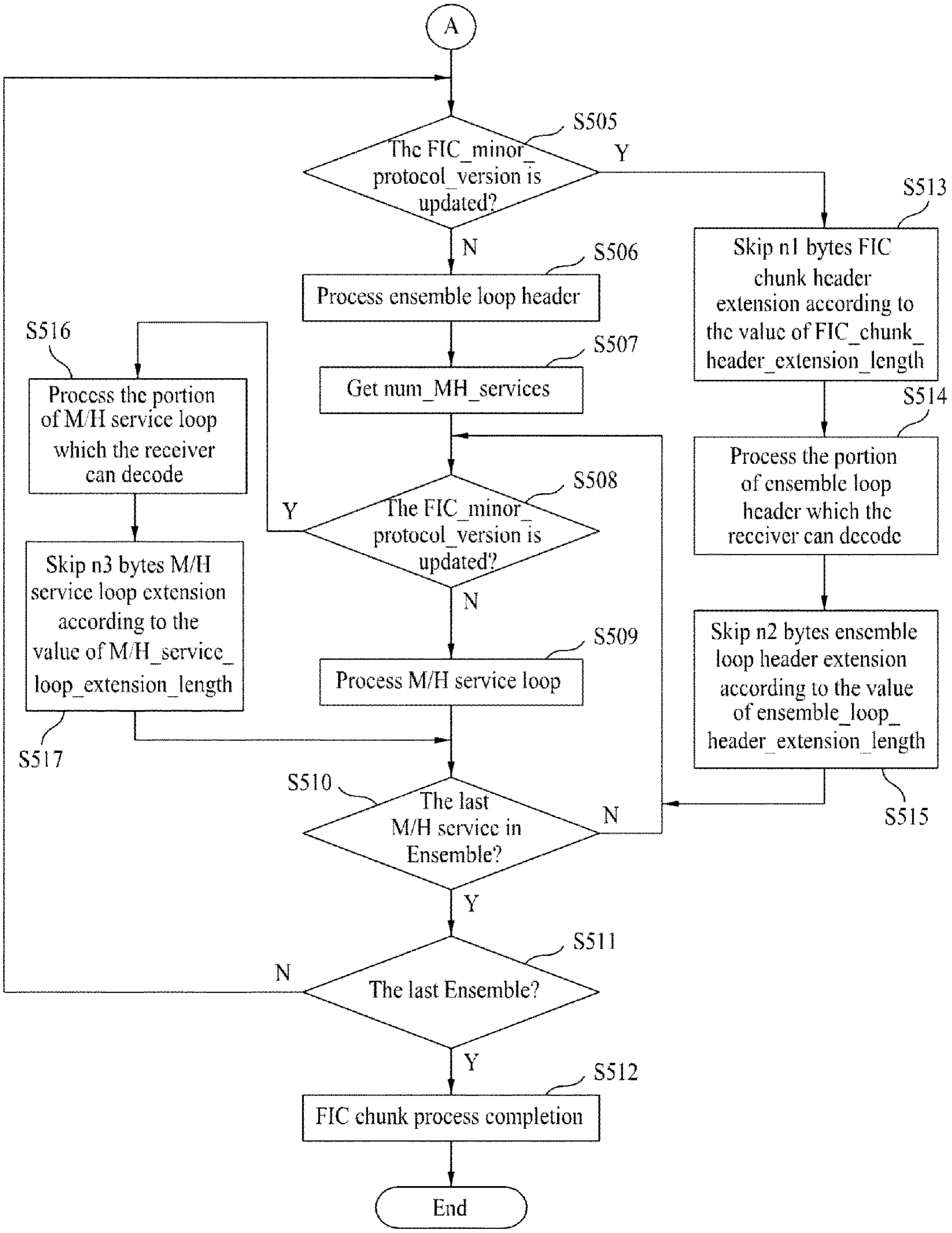

FIG. 29 and FIG. 30 illustrate flow charts showing steps for processing FIC chunks according to an embodiment of the present invention.

It is assumed that the receiving system (or receiver) applied in FIG. 29 and FIG. 30 respectively corresponds to a receiving system that cannot process an FIC chunk when the major protocol version of the corresponding FIC chunk is updated. It is also assumed that the receiving system can process only a portion of the FIC chunk when the minor protocol version of the corresponding FIC chunk is updated. Furthermore, it is assumed that the major protocol version and the minor protocol version of the FIC chunk that can be processed by the receiving system are stored in the corresponding receiving system.

More specifically, in step 501, any one of the above-described methods for recovering an FIC chunk is used so as to recover an FIC chunk from a plurality of FIC segment payloads. Herein, the FIC chunk configures of an FIC chunk header and an FIC chunk payload. And, it is assumed that the syntax structure of the FIC chunk header is the same as the one shown in FIG. 9, and that the syntax structure of the FIC chunk payload is the same as the one shown in FIG. 12.

When the FIC chunk is recovered in step 501, a portion of the FIC chunk header is parsed so as to acquire field information that is included in the FIC chunk header (S502). The field information may include information extracted from at least one of a FIC_major_protocol_version field, a FIC_minor_protocol_version field, a FIC_chunk_header_extension_length field, an ensemble_loop_header_extension_length field, an M/H_service_loop_extension_length field, a current_next_indicator field, a transport_stream_id field, and a num_ensembles field.

Subsequently, the receiving system verifies whether a major protocol version of the recovered FIC chunk is updated (S503). The update can be determined by comparing a major protocol version acquired from the FIC_major_protocol_version field within the chunk header of the recovered FIC chunk with a major protocol version of the FIC chunk stored in the receiving system. According to an embodiment of the present invention, if the value of the major protocol version corresponding to the FIC chunk acquired in step 502 is greater than the value of the major protocol version corresponding to the FIC chunk stored in the receiving system, the receiving system determines that the major protocol version of the recovered FIC chunk has been updated.

Then, when the receiving system determines that the major protocol version of the recovered FIC chunk has been updated in step 503, the processing of the FIC chunk recovered in step 501 cannot be completed (S504). In other words, the payload of the FIC chunk recovered in step 501 is not processed.

Meanwhile, if the receiving system determines that the major protocol version of the recovered FIC chunk has not been updated in step 503, the receiving system verifies whether a minor protocol version of the recovered FIC chunk has been updated (S505). The update can be determined by comparing a minor protocol version acquired from the FIC_minor_protocol_version field within the chunk header of the recovered FIC chunk with a minor protocol version of the FIC chunk stored in the receiving system.

According to an embodiment of the present invention, if the value of the minor protocol version corresponding to the FIC chunk acquired in step 502 is greater than the value of the minor protocol version corresponding to the FIC chunk stored in the receiving system, the receiving system determines that the minor protocol version of the recovered FIC chunk has been updated.

If the receiving system determines that the minor protocol version of the FIC chunk has not been updated in step 505, the receiving system processes an ensemble loop header within the payload of the FIC chunk recovered in step 501 (S506), thereby acquiring information on the number of mobile services included in the corresponding ensemble (S507). The number of mobile services can be known by referring to the num_MH_services field.

After performing step 507, the receiving system verifies once again whether the minor protocol version of the recovered FIC chunk has been updated. Since the verification method is the same as the one described in step 505, detailed description of the same will be omitted for simplicity.

If the receiving system determines, in step 508, that the minor protocol version of the corresponding FIC chunk has not been updated, the receiving system processes a mobile service loop (i.e., an M/H service loop) included in the ensemble processed in step 506 (S509). The step of processing the M/H service loop is repeated as many times as the number of mobile serviced included in the ensemble.

More specifically, after processing the M/H service loop in step 509, the receiving system verifies whether the mobile service processed in step 509 corresponds to the last M/H service included in the ensemble loop header processed in step 506 (S510). This information can be verified by referring to the num_MH_services field of the ensemble loop header.

If the verified mobile service corresponds to the last M/H service, the receiving system moves on to step 511 of the data processing method according to the present invention in order to process the next ensemble loop header. On the other hand, if the verified mobile service does not correspond to the last M/H service, the receiving system moves back (or returns) to step 508 of the data processing method according to the present invention in order to process the next M/H service loop included in the current ensemble loop header.

If it is determined in step 510 that the verified mobile service corresponds to the last M/H service, in step 511, the receiving system verifies whether the ensemble in which the last M/H service is included corresponds to the last ensemble signaled by the recovered FIC chunk. This information can be verified by referring to the num_ensembles field of the FIC chunk.

If it is determined that the current ensemble corresponds to the last ensemble, the processing of the FIC chunk is completed (S512). However, if it is determined that the current ensemble does not correspond to the last ensemble, the receiving system moves back (or returns) to step 505 of the data processing method according to the present invention in order to process the next ensemble included in the recovered FIC chunk.

Meanwhile, if it is determined in step 505 that the minor protocol version of the corresponding FIC chunk has been updated, the receiving system processes the remaining fields based upon a length information of the extension field signaled to the FIC chunk, with the exception of the corresponding extension field. Herein, the corresponding extension field is skipped.

More specifically, if the minor protocol version of the FIC chunk has been changed, based upon an n1-byte length information (wherein n1≧0) acquired from the FIC_chunk_header_extension_length field, the n1-byte FIC chunk header extension field added to the end of the corresponding FIC chunk header is skipped without being processed (S513).

In addition, when the minor protocol version of the FIC chunk has been changed, an ensemble loop header portion that can be decoded by the receiving system is processed (S514). At this point, based upon an n2-byte length information (wherein n2≧0) acquired from the ensemble_loop_header_extension_length field, the n2-byte ensemble loop header extension field added to the end of the corresponding ensemble loop header is skipped without being processed (S515).

Furthermore, when the minor protocol version of the FIC chunk has been changed, an M/H service loop portion that can be decoded by the receiving system is processed (S516). At this point, based upon an n3-byte length information (wherein n3≧0) acquired from the M/H_service_loop_extension_length field, the n3-byte M/H service loop extension field added to the end of the corresponding M/H service loop is skipped without being processed (S517).

After the M/H service loop is processed in step 516 and step 517, the receiving system verifies whether the mobile service processed in step 516 and step 517 corresponds to the last M/H service included in the ensemble loop header processed in step 514 and step 515 (S510). This information may be known by referring to the num_MH_services field of the ensemble loop header.

If the mobile service correspond to the last M/H service, the receiving system moves on to step 511 in order to process the next ensemble loop header. Conversely, if the mobile service does not correspond to the last M/H service, the receiving system returns to step 508 in order to process the next M/H service loop of the corresponding ensemble loop header.

In step 511, once the receiving system determines in step 510 that the mobile service corresponds to the last M/H service, the receiving system then verifies whether the ensemble carrying the last M/H service corresponds to the last ensemble signaled from the recovered FIC chunk. This information may be verified by referring to the num_ensembles field of the FIC chunk.

Thereafter, when the receiving system determines that the ensemble corresponds to the last ensemble signaled from the recovered chunk, the processing of the FIC chunk is completed (S512). However, of the receiving system determines that the ensemble does not correspond to the last ensemble signaled from the recovered chunk, the receiving system returns to step 505 so as to process the next ensemble included in the recovered FIC chunk.

Meanwhile, if the receiving system according to the present invention corresponds to a receiving system that can accept the change in an FIC major protocol version, the FIC chunk recovered from a plurality of FIC segments is processed normally.

Moreover, if the receiving system according to the present invention corresponds to a receiving system that can accept the change in an FIC minor protocol version, and when it is verified that the minor protocol version of the FIC chunk has been updated, based upon the length information of the extension field signaled to the FIC chunk, the FIC chunk is processed up to the corresponding extension field.

More specifically, based upon the n1-byte length information (wherein n1≧0) acquired from the FIC_chunk_header_extension_length field, the FIC chunk is processed up to the n1-byte FIC chunk header extension field added to the end of the corresponding FIC chunk header. Also, based upon the n2-byte length information (wherein n2≧0) acquired from the ensemble_loop_header_extension_length field, the FIC chunk is processed up to the n2-byte ensemble loop header extension field added to the end of the corresponding ensemble loop header. Furthermore, based upon the n3-byte length information (wherein n3≧0) acquired from the M/H_service_loop_extension_length field, the FIC chunk is processed up to the n3-byte M/H service loop extension field added to the end of the corresponding M/H service loop. For example, if the digital broadcast receiving system according to the present invention corresponds to a receiving system that can accept the change in the corresponding minor protocol version, the details (or content) specified and indicated from the corresponding extension field may be known, and operations respective to the details specified in the corresponding extension field may be performed accordingly.

As described above, the transmitting system and the receiving system and the data processing method of the same according to the present invention have the following advantages.

The present invention can signal mapping (or signaling) information between at least one ensemble and at least one mobile service by using an FIC chunk, and can divide and transmit the FIC chunk into FIC segment units, thereby enabling a receiving system to perform quick service acquisition.

Furthermore, the present invention can transmit multiple FIC segments divided from an FIC chunk through a single sub-frame or through multiple sub-frames, thereby preventing FIC segments from being wasted, when a data size of the FIC chunk is smaller or larger than the data size of the FIC segments being transmitted through a single sub-frame.

In addition, the present invention can transmit protocol version information of an FIC chunk corresponding to an FIC segment through a header of the FIC segment, thereby enabling the receiving system to accurately recover the FIC chunk by using the FIC segments configured of the corresponding protocol version, even when FIC chunks of different protocol versions co-exist in a single M/H frame.

The present invention also can transmit identification information for identifying whether the signaling information being transmitted to the payload of the corresponding FIC segment through the header of the FIC segment corresponds to signaling information of the current M/H frame or to signaling information of the next M/H frame, thereby enabling the receiving system to accurately recover the FIC chunk by using the FIC segments of the corresponding M/H frame, even when an FIC chunk signaling ensemble configuration information of the current M/H frame and an FIC chunk signaling ensemble configuration information of the next M/H frame co-exist in a single M/H frame.

More specifically, the present invention are highly protected against (or resistant to) any error that may occur when transmitting mobile service data through a channel. And, the present invention is also highly compatible to the conventional receiving system. Moreover, the present invention may also receive the mobile service data without any error even in channels having severe ghost effect and noise. Furthermore, by inserting known data in a particular position (or place) within a data region and transmitting the processed data, the receiving performance of the receiving system may be enhanced even in a channel environment that is liable to frequent changes. Finally, the present invention is even more effective when applied to mobile and portable receivers, which are also liable to a frequent change in channel and which require protection (or resistance) against intense noise.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of processing broadcast data in a broadcast transmitter, the method comprising:

performing, by a Reed Solomon (RS) frame encoder, RS encoding and Cyclic Redundancy Check (CRC) encoding on mobile service data in order to generate an RS frame belonging to an ensemble;

mapping a portion of the RS frame into at least one of a plurality of regions of a data group, the data group including known data sequences, a fast information channel (FIC) segment and transmission parameter channel (TPC) data; and transmitting a transmission frame including the data group, wherein an FIC chunk includes an FIC chunk header and an FIC chunk payload, wherein the FIC chunk payload includes at least one ensemble loop and at least one service loop, wherein the FIC chunk header includes first length information, second length information and third length information, wherein the first length information indicates a length of at least one extension field added to the FIC chunk header, wherein the second length information indicates a length of at least one extension field added to the at least one ensemble loop, wherein the third length information indicates a length of at least one extension field added to the at least one service loop, wherein the FIC chunk is segmented into a plurality of FIC segment payloads and the FIC segment in the transmitted data group includes an FIC segment header and one of the plurality of FIC segment payloads, wherein the FIC segment header includes type information indicating a type of data carried in the FIC segment, wherein the TPC data includes FIC version information for indicating an update of the FIC chunk, and wherein the at least one extension field is added to the at least one service loop by one or more minor version level changes of a syntax of the FIC chunk.

2. The method of claim 1, wherein the at least one extension field is added to the FIC chunk header by one or more minor version level changes of a syntax of the FIC chunk.

3. The method of claim 1, wherein the at least one extension field is added to the at least one ensemble loop by one or more minor version level changes of a syntax of the FIC chunk.

4. The method of claim 1, wherein the at least one extension field is added to the at least one service loop by one or more minor version level changes of a syntax of the FIC chunk.

5. A broadcast transmitter comprising:

an Reed Solomon (RS) frame encoder for performing RS encoding and Cyclic Redundancy Check (CRC) encoding on mobile service data in order to generate an RS frame belonging to an ensemble wherein a portion of the RS frame is mapped into at least one of a plurality of regions of a data group, the data group including known data sequences, a fast information channel (FIC) segment and transmission parameter channel (TPC) data, and wherein a transmission frame including the data group is transmitted to a broadcast receiver, wherein an FIC chunk includes an FIC chunk header and an FIC chunk payload, wherein the FIC chunk payload includes at least one ensemble loop and at least one service loop, wherein the FIC chunk header comprises first length information, second length information and third length information, wherein the first length information indicates a length of at least one extension field added to the FIC chunk header, wherein the second length information indicates a length of at least one extension field added to the at least one ensemble loop, wherein the third length information indicates a length of at least one extension field added to the at least one service loop, wherein the FIC chunk is segmented into a plurality of FIC segment payloads and the FIC segment in the transmitted data group includes an FIC segment header and one of the plurality of FIC segment payloads, wherein the FIC segment header includes type information indicating a type of data carried in the FIC segment, wherein the TPC data comprises FIC version information for indicating an update of the FIC chunk, and wherein the at least one ensemble loop includes an ensemble identifier for identifying the ensemble.

6. The broadcast transmitter of claim 5, wherein the at least one extension field is added to the FIC chunk header by one or more minor version level changes of a syntax of the FIC chunk.

7. The broadcast transmitter of claim 5, wherein the at least one extension field is added to the at least one ensemble loop by one or more minor version level changes of a syntax of the FIC chunk.

8. The broadcast transmitter of claim 5, wherein the at least one extension field is added to the at least one service loop by one or more minor version level changes of a syntax of the FIC chunk.

* * * * *